(12) United States Patent
Lakamraju et al.

(10) Patent No.: US 8,592,877 B2
(45) Date of Patent: Nov. 26, 2013

(54) EMBEDDED MEMS SENSORS AND RELATED METHODS

(75) Inventors: Narendra V. Lakamraju, Hillsboro, OR (US); Sameer M. Venugopal, San Jose, CA (US)

(73) Assignee: Arizona Board of Regents, a body corporate of the State of Arizona, Acting for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 13/523,755

(22) Filed: Jun. 14, 2012

(65) Prior Publication Data

US 2012/0256237 A1    Oct. 11, 2012

Related U.S. Application Data

(63) Continuation of application No. PCT/US2010/055688, filed on Nov. 5, 2010, and a continuation-in-part of application No. PCT/US2009/068528, filed on Dec. 17, 2009.

(60) Provisional application No. 61/377,752, filed on Aug. 27, 2010, provisional application No. 61/147,683, filed on Jan. 27, 2009, provisional application No. 61/174,438, filed on Apr. 30, 2009, provisional application No. 61/222,451, filed on Jul. 1, 2009.

(51) Int. Cl.
*H01L 29/84* (2006.01)

(52) U.S. Cl.
USPC ............. 257/254; 257/E29.324; 257/415

(58) Field of Classification Search
USPC ................. 257/254, 415, E29.324
See application file for complete search history.

(56) References Cited

U.S. PATENT DOCUMENTS

| | | | |
|---|---|---|---|
| 4,695,963 | A | 9/1987 | Sagisawa et al. |
| 5,983,727 | A | 11/1999 | Wellman et al. |
| 7,357,035 | B2 | 4/2008 | Liu et al. |
| 2003/0043157 | A1 | 3/2003 | Miles |
| 2004/0030258 | A1 | 2/2004 | Williams et al. |
| 2004/0154400 | A1 | 8/2004 | Johnson et al. |
| 2005/0121734 | A1 | 6/2005 | Degertekin et al. |
| 2006/0067028 | A1 | 3/2006 | Floyd |
| 2006/0067651 | A1 | 3/2006 | Chui |
| 2007/0023851 | A1 | 2/2007 | Hartzell et al. |
| 2007/0099327 | A1 | 5/2007 | Hartzell et al. |
| 2008/0112035 | A1 | 5/2008 | Cummings |
| 2009/0103166 | A1 | 4/2009 | Khazeni et al. |
| 2010/0028633 | A1 | 2/2010 | O'Rourke |
| 2010/0079848 | A1 | 4/2010 | Grasser et al. |

OTHER PUBLICATIONS

Zhou et al., "Flexible Substrate Micro-Crystalline Silicon and Gated Amorphous Silicon Strain Sensors," IEEE Transactions on Electron Devices, vol. 53, No. 2, Feb. 2006, pp. 380-385.
Saias et al., "An Above IC MEMS RF Switch," IEEE Journal of Solid-State Circuits, vol. 38, No. 12, Dec. 2003, pp. 2318-2324.
Schuenemann et al., "MEMS Modular Packaging and Interfaces," 2000 Electronic Components and Technology Conference, 2000, pp. 681-688.

(Continued)

*Primary Examiner* — Timor Karimy
(74) *Attorney, Agent, or Firm* — Bryan Cave LLP

(57) ABSTRACT

Embodiments of embedded MEMS sensors and related methods are described herein. Other embodiments and related methods are also disclosed herein.

20 Claims, 15 Drawing Sheets

(56) References Cited

OTHER PUBLICATIONS

Palasagaram et al., "MEMS Capacitive Pressure Sensor Array Fabricated Using Printed Circuit Processing Techniques," Industrial Electronics Society, IECON 2005, 31st Annual Conference of IEEE, 2005 IEEE, pp. 2357-2362.

Wu et al., "Modeling of Simultaneous Ground Shock and Airblast Pressure on Nearby Structures from Surface Explosions," International Journal of Impact Engineering 31 (2005), pp. 699-717.

Tan et al., "Enhanced Analytical Model for Micromachined Microphones," International MEMS Conference 2006, Institute of Physics Publishing, Journal of Physics: Conference Series 34 (2006), pp. 847-852.

Jawed et al., "A Switched Capacitor Interface for a Capacitive Microphone," Research in Microelectronics and Electronics 2006, Ph. D, 2006 IEEE, pp. 385-388.

Ko et al., "Touch Mode Capacitive Pressure Sensors for Industrial Applications," Tenth Annual International Workshop on Micro Electro Mechanical Systems Proceedings, MEMS '97, 1997 IEEE, pp. 284-289.

O'Rourke et al., "Active Matrix Electrophoretic Displays on Temporary Bonded Stainless Steel Substrates With 180° C. a-Si:H TFTs," Society for Information Display, International Symposium Digest of Technical Papers, SID 08 Digest, pp. 422-424.

Arana et al., "Isotropic Etching of Silicon in Fluorine Gas for MEMS Micromachining," Institute of Physics Publishing, Journal of Micromechanics and Microengineering, J. Micromech. Microeng. 17 (2007), pp. 384-392.

Chan et al., "Gas Phase Pulse Etching of Silicon for MEMS With Xenon Difluoride," Proceedings of the 1999 IEEE Canadian Conference on Electrical and Computer Engineering, Shaw Conference Center Edmonton, Alberta, Canada, May 9-12, 1999, pp. 1637-1642, vol. 3.

Allee et al., "Threshold Voltage Instability in a-SI:H TFTs and the Implications for Flexible Displays and Circuits" In: Proceedings of the Army Science Conference (26th), Orlando, Florida, Dec. 1-4, 2008, pp. 1-8.

Lakamraju, N.V. et al. "MEMS shock sensor fabricated on flexible substrate," Flexible Electronics & Displays Conference and Exhibition, Feb. 2009, ISBN: 978-1-4244-4338-3.

Jain, K. et al. "Flexible Electronics and Displays: High-Resolution, Roll-to-Roll, Projection Lithography and Photoablation Processing Technologies for High-Throughput Production," Proceedings of the IEEE, Aug. 2005, vol. 93, Issue. 8, pp. 1500-1510, ISSN: 0018-9219.

Arias, A. C. et al. "Flexible Printed Sensor Tape to Diagnose Brain Injury," 11th International Conference on Advanced Materials, Rio de Janeiro, Brazil, Sep. 2009.

Jackson, N. et al. "Flexible Chip-Scale Package and Interconnect for Implant able MEMS Movable Microelectrodes for the Brain," Journal of Microelectromec hanical systems, Apr. 2009, vol. 18, Issue 2, ISSN: 1057-7157.

Patent Cooperation Treaty PCT International Search Report and Written Opinion of the International Searching Authority for International Application No. PCT/US09/68528, Sep. 1, 2010, 8 pages.

Patent Cooperation Treaty PCT International Search Report and Written Opinion of the International Searching Authority for International Application No. PCT/US09/68523, Sep. 1, 2010, 8 pages.

Patent Cooperation Treaty PCT International Search Report and Written Opinion of the International Searching Authority for International Application No. PCT/US2010/055688, Sep. 15, 2011, 12 pages.

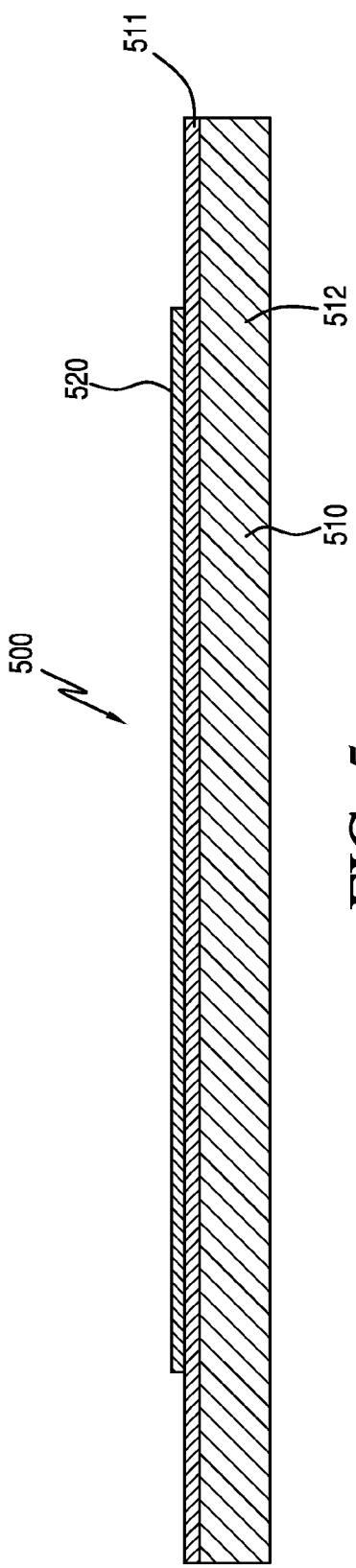
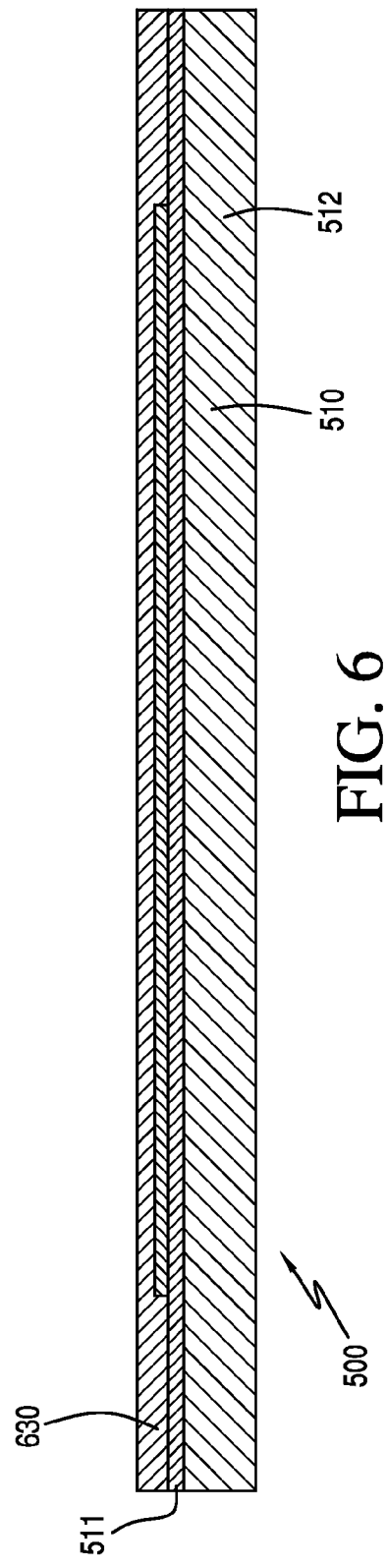

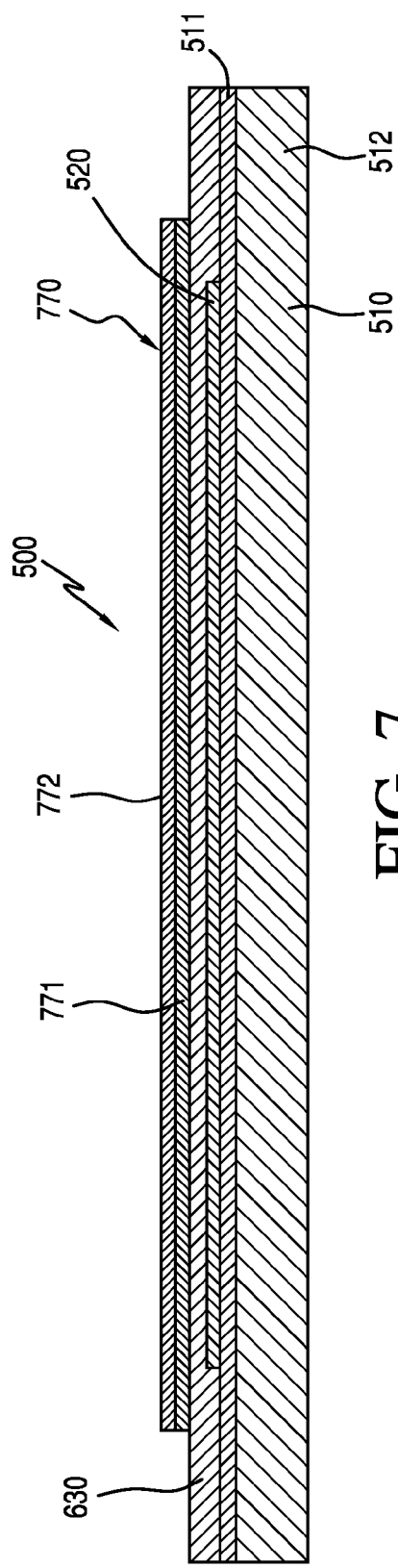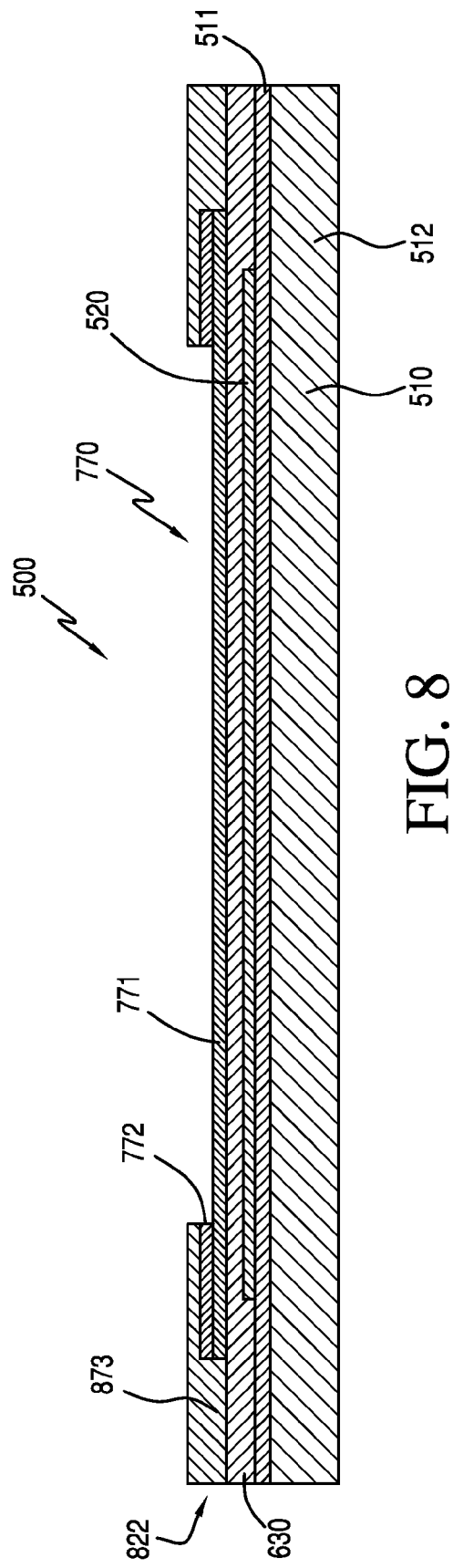

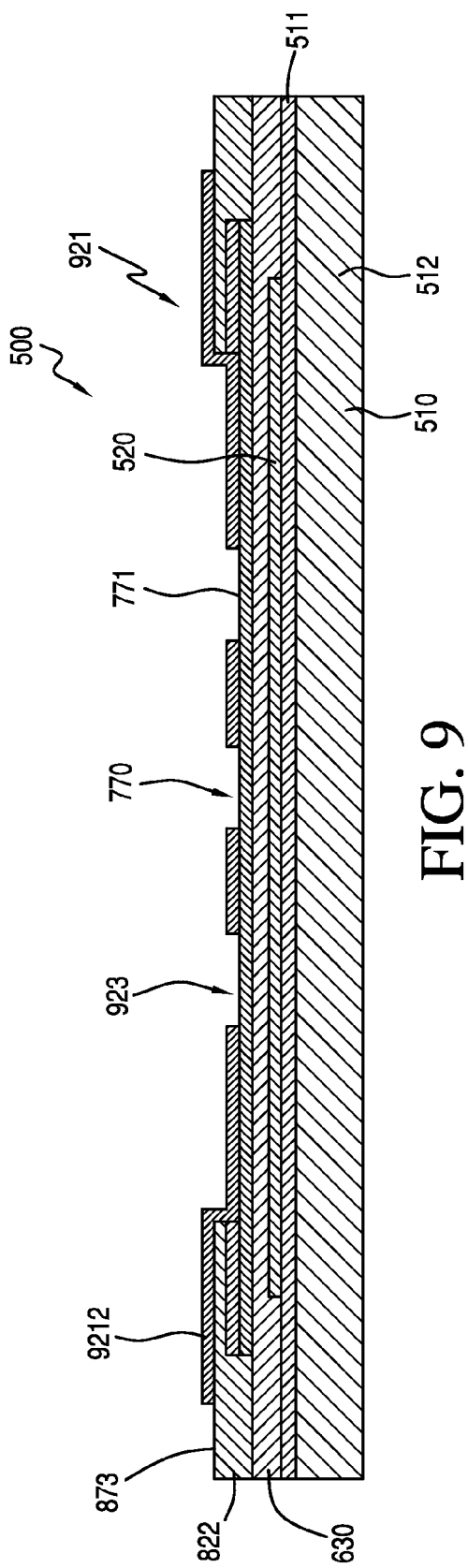
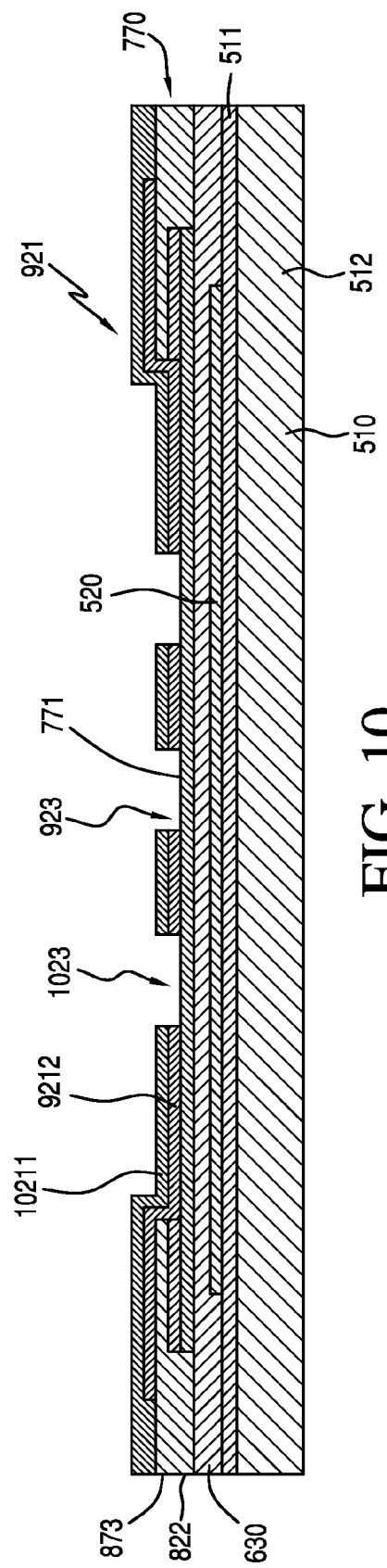

EMBEDDED MEMS SENSORS AND RELATED METHODS

CLAIM OF PRIORITY

This patent application is a continuation of International Patent Application No. PCT/US2010/055688, filed on Nov. 5, 2010, which claims the benefit of U.S. Provisional Patent Application No. 61/377,752, filed on Aug. 27, 2010. This patent application also is a continuation-in-part of International Patent Application No. PCT/US2009/068528, filed on Dec. 17, 2009, which claims the benefit of U.S. Provisional Patent Application No. 61/147,683, filed on Jan. 27, 2009, of U.S. Provisional Patent Application No. 61/174,438, filed on Apr. 30, 2009, and of U.S. Provisional Patent Application No. 61/222,451, filed on Jul. 1, 2009. The contents of the disclosures listed above are incorporated herein by reference.

GOVERNMENT FUNDING

The disclosure herein was funded with government support under: (a) Army Research Laboratory (ARL) grant/contract W911NF-04-2-0005; (b) DOD-Army Medical Research Acquisition. Activity grant/contract W81XWH-09-1-0482; and (c) DOD Congressionally Directed Medical Research Program: Deployment Related Medical Research Program grant/contract W81XWH-08-DRMRP-HAD. The United States Government may have certain rights in this application.

TECHNICAL FIELD

This invention relates generally to semiconductor devices and methods of providing semiconductor devices, and relates, more particularly, to semiconductor devices with embedded MEMS (Micro Electro Mechanical System) sensors and related methods.

BACKGROUND

In the electronics industry, flexible substrates are quickly becoming popular as a base for electronic circuits. Flexible substrates can include a wide variety of materials including, for example, any of a myriad of plastics. Once a desired electronic component, circuit, or circuits are formed over a surface of the flexible substrate, the flexible substrate can be attached to a final product or incorporated into a further structure. As an example, recent developments have fabricated display matrices on flexible substrates.

MEMS (microelectromechanical system) devices have also gained in popularity in the electronics industry. Many types of MEMS devices have been developed for a myriad of applications, including MEMS sensors configured to measure pressure variations. Due to manufacturing constraints, however, the fabrication of MEMS devices has been relegated thus far to standard substrates such as silicon substrates. Integration of MEMS devices with displays and/or other devices fabricated on flexible substrates has thus been constrained.

Shockwave-induced trauma, including closed-head brain trauma, can be difficult to diagnose and treat both in the field where quick decisions are required, as well as in a hospital environment where early decisions can impact the long-term prognosis for recovery and rehabilitation. Field decisions are crucial since appropriate immediate action for treatment can have a large effect on the long-term prognosis. Moreover, knowledge of the type and severity of traumatic brain injury sustained is critically important in developing and prescribing the appropriate longer term rehabilitation strategies. Not to be ignored is the psychological importance of being able to provide realistic expectations to the patient and his or her family and caregivers.

Therefore, a need exists in the art to develop MEMS devices compatible with flexible substrates and methods to integrate the fabrication of such MEMS devices along with other devices on flexible substrates for applications such as the detection and measurement of peak shockwave exposure and/or blast dosimetry for affected personnel.

BRIEF DESCRIPTION OF THE DRAWINGS

To facilitate further description of the embodiments, the following drawings are provided in which:

FIG. 5 illustrates a cross-sectional view of a portion of a MEMS device comprising a flexible substrate and a first plate in accordance with the method of FIG. 4.

FIG. 6 illustrates a cross-sectional view of a portion of the MEMS device of FIG. 5 further comprising a first dielectric.

FIG. 7 illustrates a cross-sectional view of a portion of the MEMS device of FIG. 6 after a first part of the formation of a sacrificial structure.

FIG. 8 illustrates a cross-sectional view of a portion of the MEMS device of FIG. 7 after a second part of the formation of the sacrificial structure.

FIG. 9 illustrates a cross-sectional view of a portion of the MEMS device of FIG. 8 after a first part of the formation of a sensor membrane.

FIG. 10 illustrates a cross-sectional view of a portion of the MEMS device of FIG. 9 after a second part of the formation of the sensor membrane.

Figure 1:
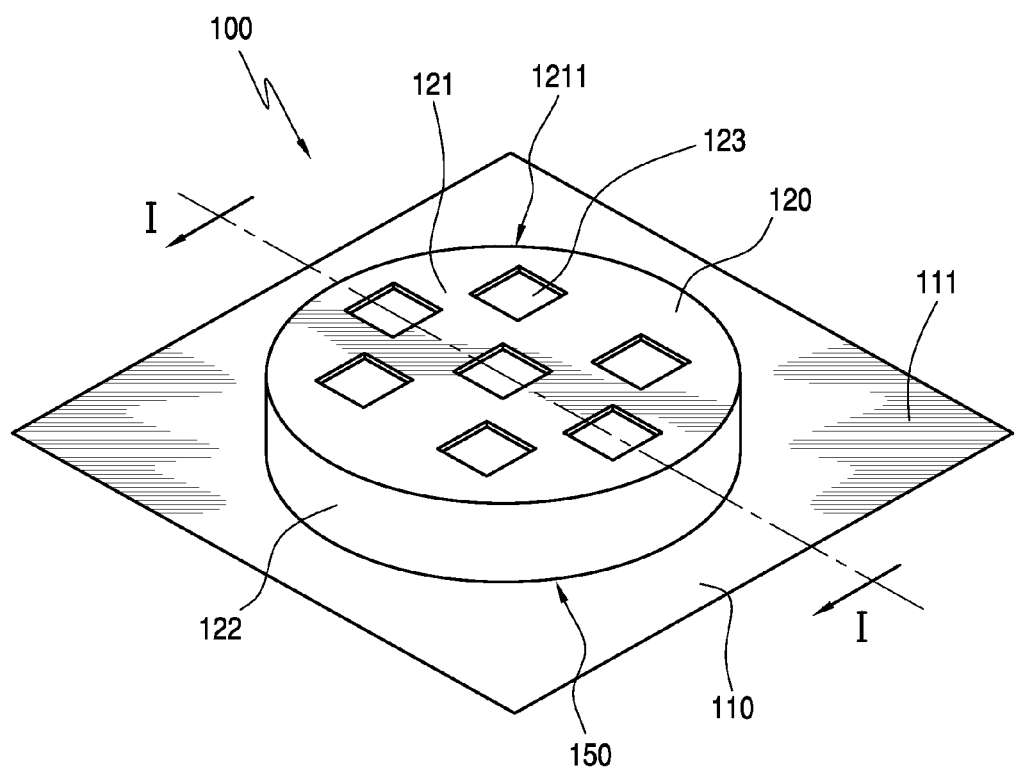
FIG. 1 illustrates a perspective view of a semiconductor device comprising a MEMS device according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "hack," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DESCRIPTION

A widely deployed, cost effective solution to provide accurate cumulative blast dose measurement will be effective in directly providing better patient care and in enabling the development of an accurate experiment-based model for the modes and severity of traumatic brain injury due to specific types, magnitudes and durations of blast dose. The technological rationale is to leverage the recent innovations in flexible substrate electronics and display technologies by integrating a MEMS-like sensor fabrication process for blast (pressure) and shock (acceleration) sensing. A single batch fabrication process integrating sensors, electronics and displays will provide the lowest cost required for wide-scale deployment.

The sensor tag may be passive in nature to eliminate the need for a constant power supply to record the information. Integration of a display element to the tag will enable triage medics to read and/or diagnose injury traumatic brain injuries and/or other blast-related injuries in the field.

In one embodiment, a semiconductor device comprises a flexible substrate and a MEMS device fabricated over the flexible substrate. In the same or a different embodiment, the semiconductor device can comprise an electronic device fabricated over the substrate and electrically coupled to the MEMS device. In the same and other embodiments, the MEMS device can comprise an electrically conductive material located over the flexible substrate, a sensor membrane movably suspended over the electrically conductive material, and a first dielectric located over the electrically conductive material and under the sensor membrane.

In one embodiment, a method for providing a semiconductor device can comprise providing a flexible substrate and forming a MEMS device over the substrate. Forming the MEMS device can comprise providing an electrically conductive layer over the substrate, providing a first dielectric over the electrically conductive layer, providing a sacrificial structure over the first dielectric, and providing a sensor membrane over the sacrificial structure.

In one embodiment, a semiconductor device can comprise a substrate, and a first MEMS array comprising one or more first MEMS devices located over the substrate and configured to register exposure to a first shock threshold level of a shockwave.

In one embodiment, a method for providing a semiconductor device can comprise providing a substrate, and forming a first MEMS device over the substrate. Forming the first MEMS device can comprise providing a conductive base over the substrate, providing a sacrificial structure over the conductive base; and providing a conductive membrane over the sacrificial structure.

In one embodiment, a semiconductor device can comprise a substrate, a first MEMS array comprising one or more first MEMS devices located over the substrate and configured to register exposure to a first shock threshold level of a shockwave, and an electronic device integrated with the substrate and the first MEMS array. The substrate can comprises a flexible substrate. At least a first MEMS device of the one or more first MEMS devices comprises (1) a first conductive base located over the substrate, (2) a first sacrificial compartment located over the first conductive base and bounded by a compartment wall; and (3) a first conductive membrane movably suspended over the first conductive base by the compartment wall. The first conductive membrane can be configured to be deformed by the shockwave to permanently short with the first conductive base after being exposed to the first shock threshold level. The electronic device can comprise a first display element, a first conductive path between the display element and the first MEMS array to source power to the display element when the first conductive membrane and the first conductive base of the first MEMS device are shorted together.

Other examples and embodiments are further disclosed herein. Such examples and embodiments may be found in the figures, in the claims, and/or in the description of the present application.

Figure 2:
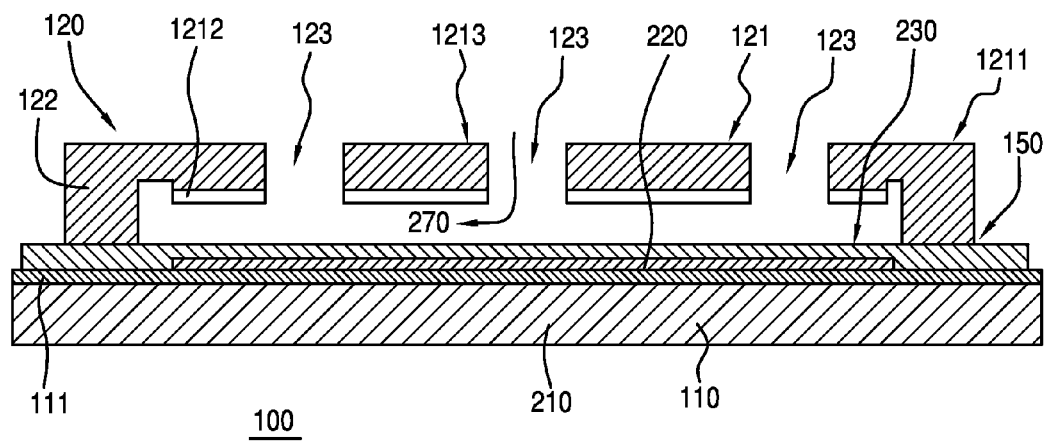
FIG. 2 illustrates a cross-sectional view along a line 1-1 of the semiconductor device of FIG. 1.

Turning to the drawings, FIG. 1 illustrates a perspective view of a semiconductor device comprising MEMS device 120 in accordance with an embodiment of the present disclosure. FIG. 2 illustrates a cross-sectional view along a line 1-1 of MEMS device 120 of FIG. 1. MEMS device 120 is merely exemplary and is not limited to the embodiments presented herein.

In the example of FIGS. 1-2, semiconductor device 100 comprises MEMS device 120 integrally fabricated over flexible semiconductor substrate 110. In the same and other examples, substrate 110 (or substrate body 210) can be a plastic substrate, and/or can comprise at least one of a flexible polyethylene naphthalate (PEN) material, such as that available from Teijin. DuPont Films of Tokyo, Japan, under the tradename planarized "Teonex® Q65," a polyethylene terephthalate (PET) material, a polyethersulfone (PES) material, a polyimide, a polycarbonate, a cyclic olefin copolymer, and/or a liquid crystal polymer. In other examples, substrate 110 can comprise other materials such as a stainless steel material, a silicon material, an iron nickel (FeNi) alloy material (e.g., FeNi, FeNi36, or Inver™; where Inver™ comprises an alloy of iron (64 percent (%)) and nickel (36%) (by weight) with some carbon and chromium), an iron nickel cobalt (FeNiCo) alloy material (e.g., Kovar™, where Kovar™ typically comprises 29% nickel, 17% cobalt, 0.2% silicon, 0.3% manganese, and 53.5% iron (by weight)), a titanium material, a tantalum material, a molybdenum material, an aluchrome material, and/or an aluminum material.

As seen in FIG. 2, semiconductor substrate 110 comprises planarization layer 111 between substrate body 210 of substrate 110 and MEMS device 120 in the present example. In some examples, planarization layer 111 can comprise a dielectric passivation material over substrate body 210, such as silicon nitride.

As illustrated in FIGS. 1-2, MEMS device 120 can be fabricated directly on substrate 110, and can comprise electrically conductive material 220 located over substrate 110, dielectric 230 located over electrically conductive material 220, and sensor membrane 121 suspended over dielectric 230. Electrically conductive material 220 comprises a metallic layer in the present example, and can comprise a metallic material such as molybdenum, tantalum, aluminum, tungsten, and/or gold in at least some embodiments. There can be some embodiments where electrically conductive material 220 can be referred to as a plate. Dielectric 230 comprises a dielectric layer in the present example, and can comprise materials such as silicon nitride, silicon dioxide ($SiO_2$), and/or polyimide, in at least some embodiments.

In the present embodiment, membrane perimeter 1211 of sensor membrane 121 is supported by wall structure 122 over dielectric 230. Wall structure 122 comprises one or more dielectric layers deposited over dielectric 230 along sensor perimeter 150 of MEMS device 120 in the present example, and can comprise a silicon nitride material in at least some embodiments. As seen in FIG. 1, sensor perimeter 150 comprises a circular shape, and membrane perimeter 1211 of sensor membrane 121 is also correspondingly circular. In the same or a different embodiment, sensor perimeter 150 and/or membrane perimeter 1211 can comprise a radius of between approximately 50 micrometers to approximately 250 micrometers. In the example of FIGS. 1-2, sensor membrane 121 comprises a radius of approximately 70 micrometers. Another example can comprise a sensor membrane with a radius of approximately 200 micrometers. There can also be other embodiments where at least one of sensor perimeter 150 and/or membrane perimeter 1211 can comprise non-circular shapes, such as oval or square shapes. With a circular shape, however, MEMS device 120 can be more stable without needing a central support, as shown in NG. 2. Wall structure 122 also defines sacrificial compartment 270 between sensor membrane 121 and dielectric 230. In the present example, sacrificial compartment 270 comprises an air gap.

As shown in FIGS. 1-2, sensor membrane 121 comprises one or more openings 123 leading to sacrificial compartment 270. In the present embodiment, MEMS device 120 comprises 7 openings 123 in sensor membrane 121, although other embodiments can comprise a different number of openings. For example, some implementations can comprise between approximately 5 to 20 openings leading to the sacrificial compartment. In the present example, one or more of openings 123 of sensor membrane 121 can measure approximately 12 micrometers by approximately 12 micrometers. In other examples where the sensor membrane comprises approximately between 10 to 150 openings, one or more of such openings can measure approximately 10-20 micrometers by approximately 10-20 micrometers. There can be further examples with openings comprising non-square perimeters, but otherwise can be similar to openings 123. In the present and other embodiments, openings 123 can be employed during the formation of sacrificial compartment 270. The formation of sacrificial compartment 270 will be further described below.

Sensor membrane 121 also comprises electrically conductive material 1212 facing dielectric 230 in the present example, where electrically conductive material 1212 can comprise a metallic material such as molybdenum, aluminum, tantalum, tungsten, and/or gold. In the same or other examples, a layer of doped amorphous silicon can also comprise part of electrically conductive material 1212 or be located adjacent thereto.

As seen in FIG. 2, electrically conductive material 1212 couples to support layer 1213 of sensor membrane 121, where support layer 1213 can be deposited above electrically conductive material 1212 during fabrication. In the present embodiment, perimeter 1211 of sensor membrane 121 comprises a perimeter of support layer 1213, and the perimeter of support layer 1213 anchors sensor membrane 121 to wall structure 122 past a perimeter of electrically conductive material 1212. In some examples, support layer 1213 can comprise a silicon nitride material, a silicon oxynitride ($SiO_xN_y$) material, a silicon dioxide ($SiO_2$) material, a passivation material, a siloxane-based material, an organosiloxane material, an organic siloxane-based material, and/or another dielectric material. In the same or other examples, support layer 1213 can comprise a PTS material such as that available from Honeywell International, Inc. of Morristown, N.J., under the name PTS-R.

In the same or a different example, support layer 1213 can comprise a thickness of between approximately 2 micrometers to approximately 2.5 micrometers. In the same or a different example, MEMS device 120 can comprise a height of between approximately 2.5 micrometers to approximately 3.5 micrometers over substrate 110.

In the present embodiment MEMS device 120 comprises a shock or pressure sensor, and is configured to sense variations in pressure by detecting changes in capacitance between sensor membrane 121 and electrically conductive material 220. In the same and other embodiments, electrically conductive material 220 and electrically conductive material 1212 of sensor membrane 121 can be considered as the plates of a capacitor, where the capacitance between the plates changes as sensor membrane 121 moves or deforms, at least temporarily, relative to electrically conductive material 220 as a result of the variations in pressure. In the same or other embodiments, when subject to shock waves and/or pressure changes, sensor membrane 121 can move or deform enough to move toward and/or make contact with dielectric 230 over electrically conductive material 220. In some embodiments, when in a steady state not subject to pressure variations, MEMS device 120 can comprise a capacitance of between approximately 1.5 picofarads and approximately 8.0 picofarads. In the same or different embodiments, MEMS device 120 can comprise a capacitance of between approximately 1.89 picofarads and approximately 7.8 picofarads. There can be embodiments where MEMS device 120 can sense pressure changes or shocks of between approximately 15 kilopascals (kPa) and 60 kPa. For example, where sensor membranes 121 comprises a radius of 70 micrometers, MEMS device 120 may be configured to sense pressure changes of approximately 50 kPa. In other examples with sensor membranes comprising a radius of 200 micrometers, pressure changes of approximately 20 kPa may be sensed.

Figure 3:
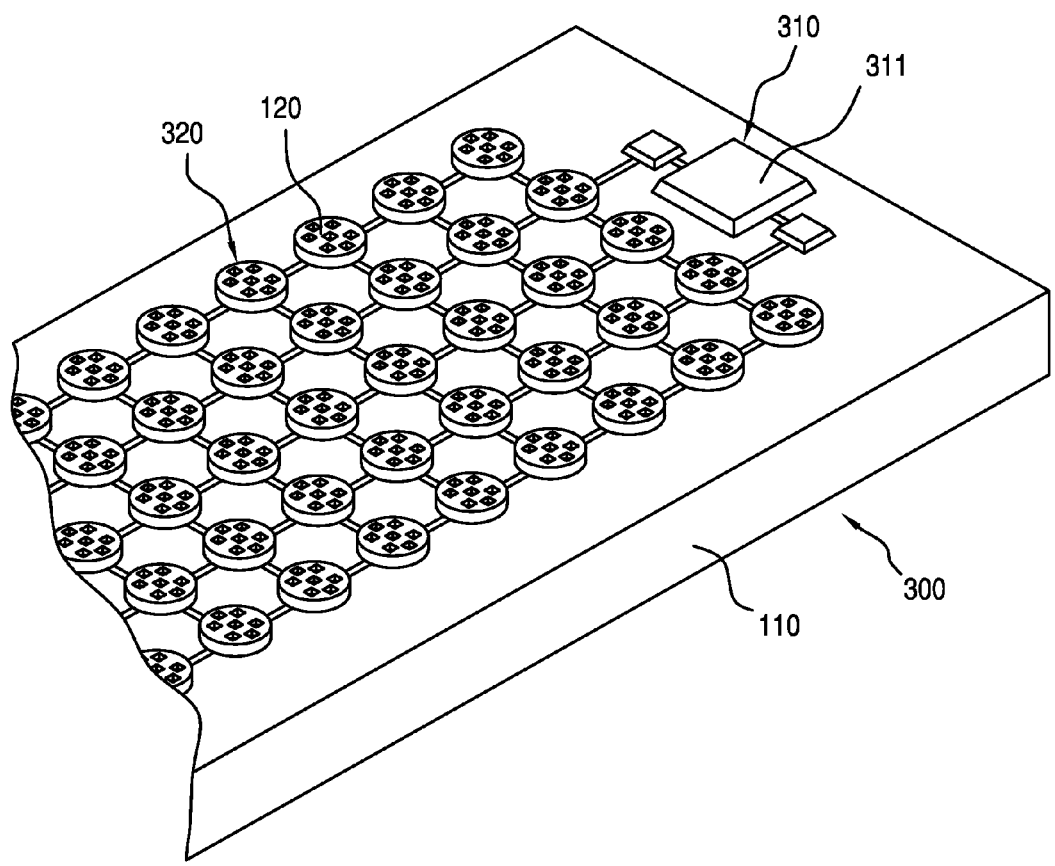
FIG. 3 illustrates a perspective view of a semiconductor device comprising a MEMS array having the MEMS device of FIGS. 1-2.

FIG. 3 illustrates a perspective view of semiconductor device 300 comprising MEMS array 320. In the embodiment of FIG. 3, MEMS array 320 comprises one or more MEMS sensors coupled together, including MEMS device 120 of FIGS. 1-2 as fabricated over substrate 110. Although the MEMS sensors of array 320 comprise the same diameter in the present examples, there can be examples where the MEMS array can comprise one or more MEMS sensors with a first diameter and one or more MEMS sensors with a different diameter and/or a different shape. In the present and other embodiments, semiconductor device 100 can comprise one or more electronic devices fabricated over substrate 110 different than MEMS device 120. For example, as shown in FIG. 3, one or more electronic devices 310, such as electronic device 311, can also be fabricated over substrate 110 and electrically coupled to MEMS device 120.

In the same or a different embodiment, MEMS device 120 and the other MEMS sensors of MEMS array 320 can be fabricated simultaneously over substrate 110 with electronic devices 310 using the same semiconductor process flow, or a modification of the semiconductor process flow, used for electronic devices 310, or vice versa. For example, electronic device 311 can comprise at least one transistor (not shown), and electrically conductive material 220 of MEMS device 120 (FIG. 2) can comprise a gate material used for a gate electrode of the at least one transistor of electronic device 311. In the same or a different example, dielectric 230 of MEMS device 120 (FIG. 2) can comprise a gate dielectric material used for a gate dielectric of the at least one transistor of electronic device 311.

Semiconductor device 300 can be implemented as a shock sensor and/or to detect pressure variations, and in the present and other examples, two or more of the MEMS sensors of MEMS array 320 can be coupled together in parallel to enhance the sensitivity of semiconductor device 300. The parallel coupling of the MEMS sensors of MEMS array 320 can increase the total capacitance of semiconductor device 300 and can help to minimize false readings by adding a level of redundancy to semiconductor device 300. In the same or other examples, such an arrangement can help to overcome false positives caused by random and/or faulty MEMS sensors.

In the present example, electronic device 311 represents a capacitance measurement circuit configured to measure and/or process the shock or pressure variations detected by MEMS array 310. In the same or a different example, semiconductor device 300 can comprise other electronic devices 310 such as display circuits (not shown) integrally fabricated over substrate 110. In such embodiments, the display circuits can comprise display elements such as pixels (picture elements) of a display, and can be electrically coupled to MEMS array 320 and/or to the capacitance measurement circuit of electronic device 311.

In the present and other implementations, semiconductor device 300 can integrate MEMS array 320 and other electronic devices 310 onto a single flexible substrate suitable for sensing and/or measuring shock or pressure variations, processing information out of the measurements, and displaying the information on the single flexible substrate. In the same or different embodiments, semiconductor device 300 can be configured to process blast dosimetry information measured at least partially via MEMS device 120 and/or to keep record of, for example, a number and/or magnitude of nearby explosions or shockwaves that a soldier has been exposed to during a period of time. In such examples, semiconductor device 300 can be attached to the soldier's gear and/or to the body of the soldier at predetermined locations, including locations expected to be exposed to peak shockwaves. As an example, semiconductor device 300 can be attached to a helmet and/or near the top back of the skull of the soldier. In the same or other examples, semiconductor device 300 can be attached with or as an adhesive bandage.

Figure 4:
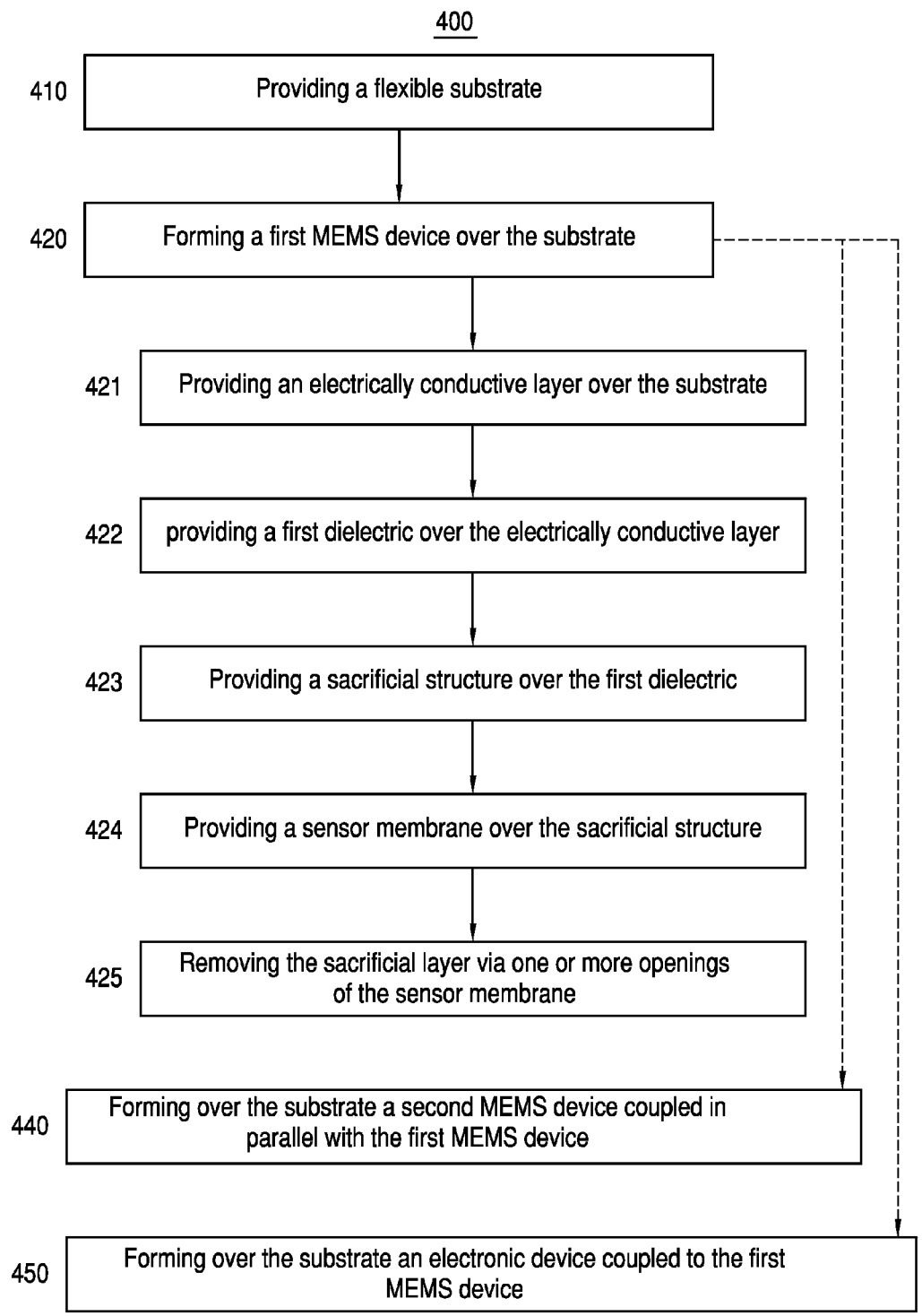
FIG. 4 illustrates a flowchart for a method for providing a semiconductor device.

Moving along, FIG. 4 illustrates a flowchart for a method 400 that can be used for providing a semiconductor device. In the same or different embodiments, method 400 can be considered a method of manufacturing a MEMS device, such as MEMS device 120 (FIGS. 1-3), over a flexible substrate. Method 400 is merely exemplary and is not limited to the embodiments presented herein. Method 400 can be employed in many different embodiments or examples not specifically depicted or described herein.

Method 400 includes a procedure 410 of providing a substrate. FIG. 5 illustrates a cross-sectional view of a portion of MEMS device 500 comprising substrate 510, where substrate 510 can be similar to the substrate of procedure 410 and/or to substrate 110 (FIGS. 1-2) in some embodiments. In the same or different embodiments, procedure 410 of method 400 can include providing a flexible substrate. In many examples, the flexible substrate can be a plastic substrate. For example, in the embodiment of FIG. 5, body 512 of substrate 510 can be similar to substrate body 210 in FIG. 2, and can comprise a flexible polyethylene naphthalate (PEN) material, such as that available from Teijin DuPont Films of Tokyo, Japan, sold under the tradename planarized "Teonex® Q65." In other embodiments, the substrate of procedure 410 can comprise a flexible substrate comprising polyethylene terephthalate (PET), polyethersulfone (PES), polyimide, polycarbonate, cyclic olefin copolymer, and/or liquid crystal polymer. The thickness of the substrate of method 400 can be in the range of approximately 25 micrometers to approximately 300 micrometers in some embodiments. In the same or different embodiments, the thickness of the substrate can be in the range of approximately 100 micrometers to approximately 200 micrometers.

In some examples, procedure 410 can further comprise providing a planarized surface over the substrate. In the example of FIG. 5, the planarized surface of procedure 410 can be formed by planarization layer 511, where layer 511 can comprise a passivation layer at the top of substrate 510. In some embodiments, planarization layer 511 can comprise a dielectric material such as silicon nitride, and can have a thickness of approximately 3000 Angstroms. Layer 511 can be similar to planarization layer 111 in FIG. 2.

In a different example, procedure 410 can include providing a stainless steel flexible substrate. In still further examples, the substrate of procedure 410 can include silicon, iron nickel (FeNi) alloys (e.g., FeNi, FeNi36, or Inver™;

where Inver™ comprises an alloy of iron (64%) and nickel (36%) (by weight) with some carbon and chromium), iron nickel cobalt (FeNiCo) alloys (e.g., Kovar™, where Kovar™ typically comprises 29% nickel, 17% cobalt, 0.2% silicon, 0.3% manganese, and 53.5% iron (by weight)), titanium, tantalum, molybdenum, aluchrome, and/or aluminum.

In the same or different embodiments, the substrate of procedure 410 can be coupled to a carrier (not shown) to provide rigidity and/or to support the substrate. In various embodiments, the carrier includes at least one of the following: alumina ($Al_2O_3$), silicon, glass, steel, sapphire, barium borosilicate, soda lime silicate, alkali silicates, or other materials. The carrier can be coupled to the substrate using an adhesive or by other means. For example, the carrier could comprise sapphire with a thickness between approximately 0.7 millimeters (mm) and approximately 1.1 mm. The carrier could also comprise 96% alumina with a thickness between approximately 0.7 mm and approximately 1.1 mm. In a different embodiment, the thickness of the 96% alumina can be approximately 2.0 mm. In another example, the carrier could comprise single crystal silicon with a thickness of at least approximately 0.65 mm. In some examples, the carrier is slightly larger than the substrate.

The substrate of procedure 410 can be cleaned in some examples to remove any particles on the substrate. In some embodiments, the substrate can be cleaned to remove any adhesives on the substrate. For example, if the substrate is stainless steel, the substrate can be washed with hexanes for approximately twenty seconds while spinning at approximately 1,000 rpm (revolutions per minute). In some examples, the edge of the substrate can be sprayed with hexanes for the last ten seconds. Afterwards, the substrate can be spun at approximately 3,000 rpm for approximately twenty seconds to dry the substrate. In some examples, the substrate can be baked for approximately sixty seconds at approximately 105 degrees Celsius (° C.) to further dry the substrate.

To remove large particles from the substrate, the substrate of procedure 410 can be scrubbed. For example, if the substrate is stainless steel, the substrate can be scrubbed with soap and water (e.g., 40 milliliters (mL) of Alconox Detergent 8 mixed with one liter of water) using a sponge. Alconox Detergent 8 is manufactured by Alconox, Inc. of White Plains, N.Y. Organics can also be removed from the substrate by ashing in some examples. For example, if the substrate is stainless steel, the substrate can be ashed for approximately ninety minutes in an oxygen ($O_2$) environment at a pressure of approximately 1,200 milliTorr.

Continuing with method 400, procedure 420 comprises forming a first MEMS device over the substrate of procedure 410. In some embodiments, the first MEMS device of procedure 420 can be similar to MEMS device 120 from FIGS. 1-3). In the same or different embodiments, procedure 420 can comprise several subparts such as such as procedures 421-425.

In the present example of FIG. 4, procedure 421 comprises providing an electrically conductive layer over the substrate of procedure 410. In some embodiments, the electrically conductive layer can be referred to as a gate layer or as a first plate. In the same or other embodiments, the electrically conductive layer of procedure 421 can be similar to plate 520 of MEMS device 500 in FIG. 5. In turn, plate 520 can be similar to electrically conductive material 220 of semiconductor device 100 (FIG. 2). In the same or a different embodiments, plate 520 can be deposited over substrate 510 and then patterned to a desired form.

Procedure 422 of method 400 comprises providing a first dielectric over the electrically conductive layer of procedure 421. FIG. 6 illustrates a cross-sectional view of a portion of MEMS device 500 comprising dielectric 630, where dielectric 630 can be similar to the first dielectric of procedure 420 and/or to dielectric 230 (FIG. 2) in some embodiments. Dielectric 630 is deposited over planarization layer 511 of substrate 510 in the present example to a thickness of approximately 3000 Angstroms.

Procedure 423 of method 400 comprises providing a sacrificial structure over the first dielectric of procedure 422. In some examples, the sacrificial structure can be used to form sacrificial compartment 270 (FIG. 2) described for MEMS device 120 above. In the same or a different example, the sacrificial structure can be similar to sacrificial structure 770 as described in FIGS. 7-8. FIG. 7 illustrates a cross-sectional view of a portion of MEMS device 500 after a first part of the formation of sacrificial structure 770. FIG. 8 illustrates a cross-sectional view of a portion of MEMS device 500 after a second part of the formation of sacrificial structure 770.

In the present example of method 400, part of procedure 423 comprises providing a sacrificial layer over the first dielectric of procedure 422. In the example of FIG. 7, sacrificial layer 771 deposited over dielectric 630 can be similar to the sacrificial layer of procedure 423 of method 400. In some examples, sacrificial layer 771 can comprise an amorphous silicon channel material. In the same or other examples, the sacrificial layer can be deposited over dielectric 630 to a thickness of approximately 0.08 micrometers. In the present example, sacrificial structure 770 also comprises dielectric layer 772 deposited over sacrificial layer 771, where dielectric layer 772 can comprise a patterned silicon nitride intermetal dielectric (IMD) layer having a thickness of approximately 0.10 micrometers in some examples. In other embodiments, sacrificial structure 700 can comprise a single layer.

In the present example, part of procedure 423 of method 400 can also comprise providing a compartment wall at a perimeter of the sacrificial layer and over the first dielectric, where the compartment wall for procedure 423 can be similar to wall structure 122 of semiconductor device 100 (FIGS. 1-2). In the same or different examples, now referring to FIG. 8, compartment wall 822 can correspond to the compartment wall for procedure 423 as formed by dielectric layer 873. In the present example, dielectric layer 873 comprises a patterned approximately 0.10 micrometer thick silicon nitride layer. In the same or other examples, dielectric layer 873 can comprise a passivation material. There can also be other examples where dielectric layer 873 can comprise other dielectric materials and/or IMD layer.

As seen in FIG. 8, compartment wall 822 can be formed by providing one or more dielectric layers, such as dielectric layers 772 and 873, over sacrificial layer 771. In other examples, dielectric layer 772 can be omitted from compartment wall 822 such that compartment wall 822 would only comprise a single dielectric layer comprising the space occupied by dielectric layers 772 and 873 in FIG. 8. A perimeter of dielectric layer 873 contacts dielectric 630 in the present example past a perimeter of sacrificial layer 771 and dielectric layer 772. As a result, compartment wall 822 bounds the perimeter of sacrificial layer 771 and dielectric layer 772 in the present example.

Once placed over sacrificial layer 771, the one or more dielectric layers described above can be patterned to remove portions thereof over sacrificial layer 771 and thereby further define compartment wall 822. For example, FIG. 8 presents dielectric layers 873 and 772 after being etched to expose at least part of sacrificial layer 771.

Figure 11:
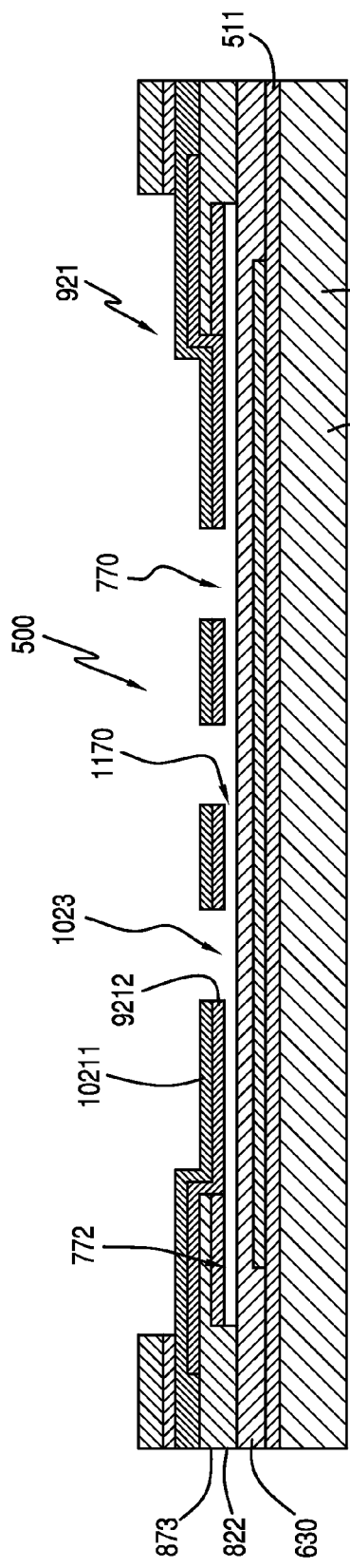
FIG. 11 illustrates a cross-sectional view of a portion of the MEMS device of FIG. 10 after removal of the sacrificial layer.

Continuing with method 400, procedure 424 comprises providing a sensor membrane over the sacrificial structure of procedure 423. In some examples, the sensor membrane of procedure 424 can be similar to sensor membrane 121 of MEMS device 120 (FIGS. 1-2). In the same or different examples, the sensor membrane of procedure 424 and/or sensor membrane 121 can be similar to sensor membrane 921 as illustrated in FIGS. 9-11, and/or can comprise a substantially circular perimeter.

In the present example, part of procedure 424 comprises providing a second electrically conductive layer over the sacrificial structure of procedure 423. FIG. 9 illustrates a cross-sectional view of a portion of MEMS device 500 after a first part of the formation of sensor membrane 921. In the embodiment of FIG. 9, the second electrically conductive layer described for procedure 424 can be similar to plate 9212 of sensor membrane 921 over sacrificial structure 770. In the same or a different embodiment, the second electrically conductive layer of procedure 424 and/or plate 9212 can be similar to electrically conductive material 1212 described above for MEMS device 120 (FIG. 2). In some examples, plate 9212 can have a thickness of approximately 0.20 micrometers. In the same or different examples, plate 9212 can comprise at least one of an aluminum material, a molybdenum material, a tungsten material, a gold material and/or a tantalum material. There may be embodiments where plate 9212 can comprise a stack of more than one material.

As seen in FIG. 9, one or more openings 923 can be etched through plate 9212 to expose one or more portions of sacrificial structure 770 and/or of sacrificial layer 771 in at least some embodiments. Openings 923 can be similar, for example, to openings 123 through membrane 121 of MEMS device 120 as described above for FIGS. 1-2. In the same or different examples, plate 9212 can be etched in one in-situ etching procedure with dielectric layer 873 and/or sacrificial layer 771 acting as etch stop layers. In some examples, plate 9212 can be etched using an AMAT 8330, manufactured by Applied Material, Inc. of Santa Clara, Calif. A perimeter of plate 9212 can extend beyond a perimeter of plate 520, as illustrated in FIG. 9.

Another part of procedure 424 of method 400 can comprise providing a structural layer over the second electrically conductive layer. As an example, FIG. 10 illustrates a cross-sectional view of a portion of MEMS device 500 after a second part of the formation of sensor membrane 921. In the embodiment of FIG. 10, the structural layer described for procedure 424 can be similar to structural layer 10211 of sensor membrane 921 over plate 9212. In the same or a different embodiment, the structural layer of procedure 424 and/or structural layer 10211 can be similar to support layer 1213 described above for MEMS device 120 (FIG. 2), and can comprise similar materials. There may be embodiments where structural layer 10211 can comprise a stack of more than one material. In the present example of FIG. 10, a perimeter of structural layer 10211 is shown coupled with a perimeter of sacrificial structure 770 past a perimeter of plate 9212. As a result, the perimeter of structural layer 10211 contacts with dielectric layer 873 at the perimeter of compartment wall 822 and bounds the perimeter of plate 9212 in the present example. As seen in FIG. 10, one or more openings 1023 can be etched through structural layer 10211 to expose one or more portions of sacrificial structure 770 and/or of sacrificial layer 771 in at least some embodiments. Openings 1023 can be similar to, and substantially aligned with, openings 923 as etched through plate 9212, and can also be similar to openings 123 through membrane 121 of MEMS device 120 as described above for FIGS. 1-2. In some examples, openings 1023 can be plasma etched. In the same of different embodiments, openings 1023 can be etched with a fluorine-based etchant. In some examples, the etchant can be trifluoromethane ($CHF_3$), sulfur hexafluoride ($SF_6$), or other fluorine-based etchants. In some embodiments, openings 1023 can be formed before openings 923, and after forming openings 1023, the remainder of structural layer 10211 can be used as a self-aligned etch mask for openings 923.

There can be examples, including those where the substrate of procedure 410 comprises a plastic substrate, where the different procedures of method 400 to form the first MEMS device are carried out at temperatures not exceeding approximately 190 degrees Celsius. In such examples, the low temperature at which the MEMS device of procedure 420 is fabricated can assist in preventing heat-related damage to the substrate of procedure 410 and/or to elements of the MEMS device of procedure 420.

Continuing with method 400, procedure 425 comprises removing the sacrificial layer described above for procedure 423 via one or more openings of the sensor membrane of procedure 424. In some examples, a sacrificial compartment similar to sacrificial compartment 270 of MEMS device 120 (FIG. 2) remains between the sensor membrane of procedure 424 and the first dielectric of procedure 422 after the sacrificial layer is removed in procedure 425. FIG. 11 illustrates a cross-sectional view of a portion of MEMS device 500 after removal of sacrificial layer 771 from sacrificial compartment 1170 between sensor membrane 921 and dielectric 630 in accordance with an implementation of procedure 425 of method 400. In the example of FIG. 11, sacrificial layer 771 has been removed via etching through openings 1023 of sensor membrane 921 to release sensor membrane 921. In some examples, the etching through openings 1023 can be performed using a dry etch process. In the same or a different example, the etching through openings 1023 can comprise the use of a xenon difluoride ($XeF_2$) reactant or another gaseous reactant. The use of a dry etchant eliminates the problem of stiction when a wet etchant is used. In the same or a different example, the reactant used for etching sacrificial layer 771 comprises enough selectivity to etch only at sacrificial layer 771 without etching or at least without substantially etching sacrificial structure 770 or any other element bounding sacrificial compartment 1170, including plate 9212, dielectric 630, compartment wall 822, dielectric layer 873, structural layer 10211, or dielectric layer 772. In the same or a different example, no separate masking is needed prior to carrying out the etch of sacrificial layer 771.

In some examples, method 400 can comprise procedure 440, comprising forming over the substrate a second MEMS device electrically coupled in parallel with the first MEMS device of procedure 420. In some examples, the second MEMS device can be similar to the first MEMS device and/or can be manufactured using the same semiconductor process flow. In the same or a different example, the first and second MEMS devices of method 400 can be coupled together as described above with respect to FIG. 3 for the MEMS sensors of MEMS array 320. In the same or a different example, the second MEMS device of procedure 440 can comprise a sensor membrane with a diameter and/or a perimeter different than a diameter and/or a perimeter of the sensor membrane provided in procedure 424 for the first MEMS device of procedure 420.

There can be some examples where method 400 also can comprise procedure 450, comprising forming over the substrate an electronic device electrically coupled to the MEMS device of procedure 420. In the same or a different example, the electronic device can be similar to one of electronic devices 310 described above for FIG. 3, and/or could comprise at least part of a display element and/or a capacitance measurement circuit.

Figure 12:
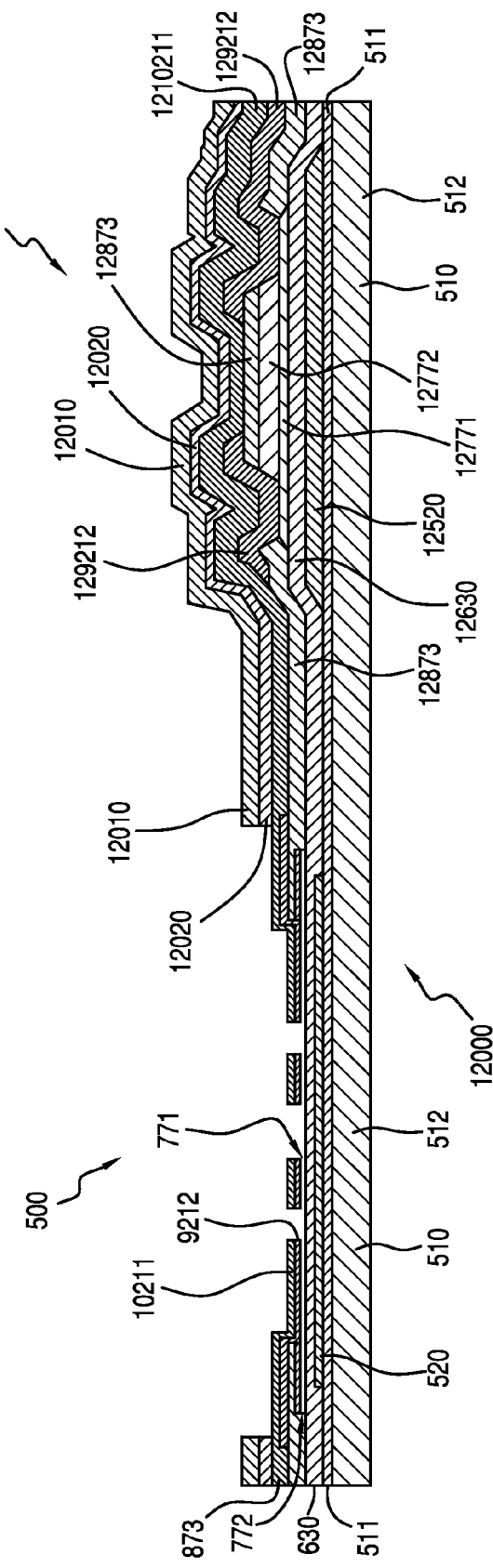
FIG. 12 illustrates a cross-sectional view of a semiconductor device comprising both the MEMS device of FIG. 11 and an electronic device 12500 fabricated over the same flexible substrate.

In some embodiments, method 400 can be implemented such that the MEMS device of procedure 420 is fabricated pursuant to a semiconductor process flow for the electronic device of procedure 450 over the flexible substrate of procedure 410, or a modification of such semiconductor process flow. As an example, FIG. 12 illustrates a cross-sectional view of semiconductor device 12000 comprising both MEMS device 500 and electronic device 12500 fabricated over flexible substrate 510. In some examples, electronic device 12500 can correspond to at least part of the electronic device of procedure 450. In the same or a different examples, the part of the electronic device comprises a transistor, and in particular, a thin film transistor.

As can be seen in FIG. 12, MEMS device 500 shares substrate 510, including body 512 and planarization layer 511, with electronic device 12500. Other elements of MEMS device 500 can be fabricated with layers used to fabricate corresponding elements of electronic device 12500. For example, plate 520 of MEMS device 500 can be fabricated out of the same layer or electrically conductive material used to fabricate gate electrode 12520 of electronic device 12500. As a result, the electrical conductive material of plate 520 and the gate electrode of electronic device 12500 can be provided simultaneously during the fabrication of semiconductor device 12000.

In similar fashion, dielectric 630 of MEMS device 500 can be fabricated out of the same layer of material used to fabricate gate dielectric 12630 of electronic device 12500. As a result, dielectric 630 and gate dielectric 12630 can be provided simultaneously during fabrication of semiconductor device 12000.

Plate 9212 of sensor membrane 921 if MEMS device 500 can be fabricated out of the same layer or layers of electrically conductive material as source/drain conductive layer 129212 of electronic device 12500. As a result, plate 9212 and source/drain conductive layer 129212 can be provided simultaneously during fabrication of semiconductor device 12000.

Structural layer 10211 of sensor membrane 921 of MEMS device 500 can be fabricated out of the same layer or layers of material used to fabricate planarization layer 1210211 of electronic device 12500. As a result, structural layer 10211 and planarization layer 1210211 can be provided simultaneously during fabrication of semiconductor device 12000.

Other elements of MEMS device 500 can be similarly fabricated based on layers used to fabricate elements of electronic device 12500. For example, although sacrificial layer 771 is already removed from MEMS device 500 in FIG. 12, in accordance with procedure 425 of method 400, sacrificial layer 771 of MEMS device 500 can be fabricated out of the same layer of channel material used to fabricate channel 12771 of electronic device 12500. Similarly, dielectric layer 772 of MEMS device 500 can be fabricated out of the same layer of material used to fabricate IMD layer 12772 of electronic device 12500. Dielectric layer 873 of MEMS device 500 can be fabricated out of the same layer of material used to fabricate passivation layer 12873 of electronic device 12500.

In the example of FIG. 12, layer 12020 is located over planarization layer 1210211 of electronic device 12500, and layer 12010 is located over layer 12020 of electronic device 12500. In some examples, layer 12020 can comprise an indium-tin-oxide material, and/or layer 12010 can comprise silicon nitride or other dielectric material configured to create an overglass protection layer. Although layers 12010 and 12020 are not needed in the present example for MEMS device 500, MEMS device 500 is still compatible with the semiconductor process for electronic device 12500. For example, layers 12010 and 12020 can be formed and patterned over structural layer 10211 before the removal of sacrificial layer 771.

In some examples, one or more of the different procedures of method 400 can be combined into a single step or performed simultaneously, and/or the sequence of such procedures can be changed. For example, procedure 450 could be performed before procedure 440 in some examples. In other examples, the first MEMS device of procedure 420, the second MEMS device of procedure 440, and the electronic device of procedure 450 can be fabricated simultaneously and/or combined into a single step. There can also be examples where method 400 can comprise further or different procedures. As an example, a procedure could be added after procedure 450 to form a second electronic device over the substrate of procedure 410. In such an example, the electronic device of procedure 450 could form part of a capacitance measurement circuit, and the electronic device of procedure 460 could form part of a display circuit for the semiconductor device of method 400. Other variations can be implemented for method 400 without departing from the scope of the present disclosure.

Figure 13:
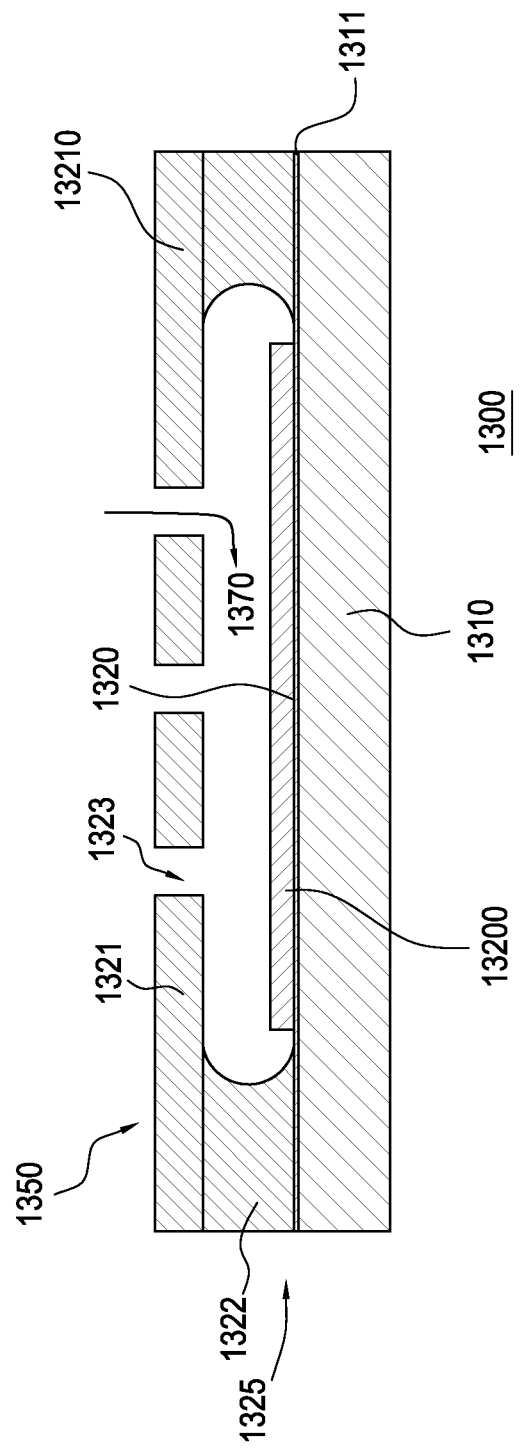
FIG. 13 illustrates a cross-sectional view of a semiconductor device comprising a MEMS device

Continuing with the figures, FIG. 13 illustrates a cross-sectional view of a semiconductor device 1300 comprising MEMS device 1350. In some embodiments, semiconductor device 1300 can be similar to semiconductor device 100 (FIGS. 1-2), to semiconductor device 300 (FIG. 3), to the semiconductor device of method 400 in FIG. 4, and/or to semiconductor device 12000 (FIG. 12). In addition, MEMS device 1350 can be similar to MEMS device 120 (FIGS. 1-3), to the first MEMS device of method 400 in FIG. 4, and/or to MEMS device 500 (FIGS. 5-12).

In the present example, semiconductor device 1300 comprises several elements that are similar to corresponding elements of other semiconductor devices previously described herein. For example, semiconductor device 1300 comprises substrate 1310, which can be similar to substrate body 210 (FIG. 2), and planarization layer 1311, which can be similar to planarization layer 111 (FIG. 2). There can be examples where planarization layer 1311 may be optional. MEMS device 1350 comprises conductive base 1320, formed out of conductive layer 13200, which can be similar to conductive material 220 (FIG. 2). In addition, wall structure 1322 of MEMS device 1350 can be similar to wall structure 122 in FIG. 2. Although in the present example wall structure 1322 is located over substrate 1310, there can be other examples where conductive base 1320 may extend further so that wall structure 1322 also can be located over conductive base 1320.

MEMS device 1350 also comprises conductive membrane 1321, formed out of membrane layer 13210, which can be similar to conductive material 1212 in FIG. 2. In the same or other examples, conductive membrane 1321 can comprise at lest one of a chromium material, a silver material, an aluminum material, a titanium material, or a copper material.

In addition, sacrificial compartment 1370 of MEMS device 1350 can be similar to sacrificial compartment 270 (FIG. 2). In some examples, sacrificial compartment 1370 may comprise an air gap of approximately 0.08 microns to approximately 2 microns between conductive membrane 1321 and conductive base 1322. Conductive membrane 1321 comprises membrane openings 1323, similar to openings 123 (FIGS. 1-2), to expose and provide access to sacrificial compartment 1370.

Although MEMS device 1350 can be similar in many respects, as described above, to other MEMS devices previously described, MEMS device 1350 can differ in one or more respects. For example, conductive base 1320 is still separated from conductive membrane 1321 by the air gap of sacrificial compartment 1370, but there is no dielectric layer similar to dielectric layer 230 (FIG. 2) to isolate or restrict contact between conductive base 1320 and conductive membrane 1321. As a result, conductive membrane 1321 is configured to permanently short with conductive base 1320 if sufficiently flexed or collapsed, such as by a shockwave, towards conductive base 1320. In another embodiment, conductive membrane 1321 is only temporarily shorted with conductive base 1320 after being flexed by a shockwave and subsequently flexes back towards its original configuration. In addition, whereas conductive material 1212 was supported over sacrificial compartment 270 by support layer 1213 in FIG. 2, conductive membrane 1321 is sits atop wall structure 1322 in the present example without the need for a separate support layer. Furthermore, wall structure 1322 in the present example comprises the same sacrificial material of sacrificial layer 1325, out of which sacrificial compartment 1370 is formed. Wall structure 1322 thus contrasts with wall structure 122 (FIGS. 1-2) and compartment wall 822 (FIGS. 8-12), both of which comprise dielectric layers and materials different than the material(s) removed to form sacrificial compartments 270 (FIG. 2) and 1170 (FIG. 11).

Figure 14:
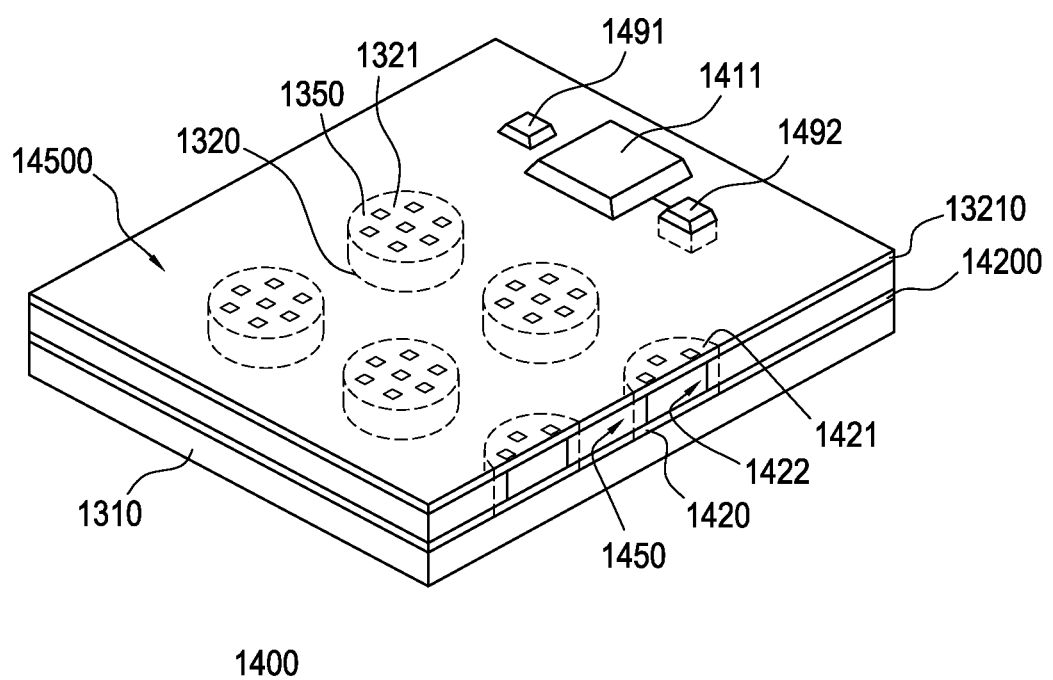
FIG. 14 illustrates a perspective view of the semiconductor device of FIG. 13, where the MEMS device of FIG. 13 is part of a MEMS array.

FIG. 14 illustrates a perspective view of semiconductor device 1400, comprising MEMS device 1450 as part of MEMS array 14500. In some examples, MEMS array 14500 can be similar to MEMS array 320 (FIG. 3). Although in the present example MEMS array 14500 comprises a plurality of MEMS devices, there can be other embodiments where MEMS array 14500 comprises only one MEMS device, such as MEMS device 1450.

MEMS device 1450 can be similar to MEMS device 1350 (FIG. 13), and comprises conductive membrane 1421 similar to conductive membrane 1321 (FIG. 13), and conductive base 1420 similar to conductive base 1320 (FIG. 13). In the present example, wall structure 1422 of MEMS device 1450 is formed over conductive layer 14200, which is similar to conductive layer 13200. MEMS device 1450 differs from MEMS device 1350 in that wall structure 1422 is formed over conductive layer 14220, such that conductive base 1420 is not delimited by wall structure 1422 and is comprised by conductive layer 14200 as extended across MEMS array 14500.

Figure 16:
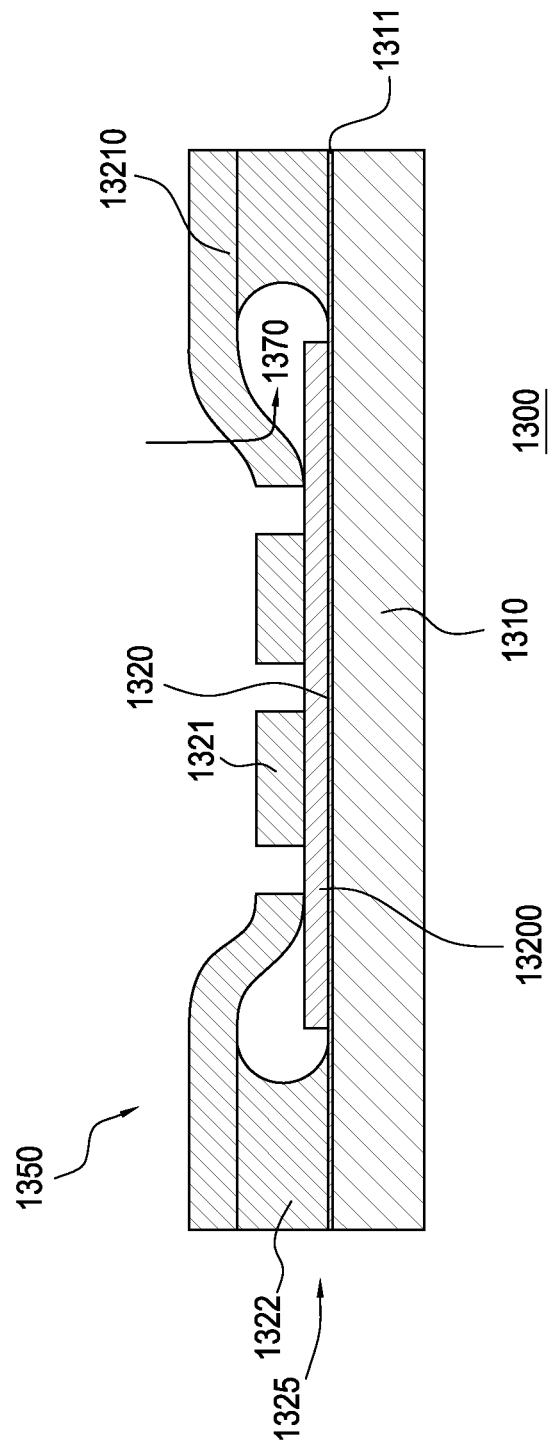
FIG. 16 illustrates a cross-sectional view of the MEMS device of FIG. 13 a conductive membrane permanently collapsed and shorted with a conductive base thereof.
Figure 17:
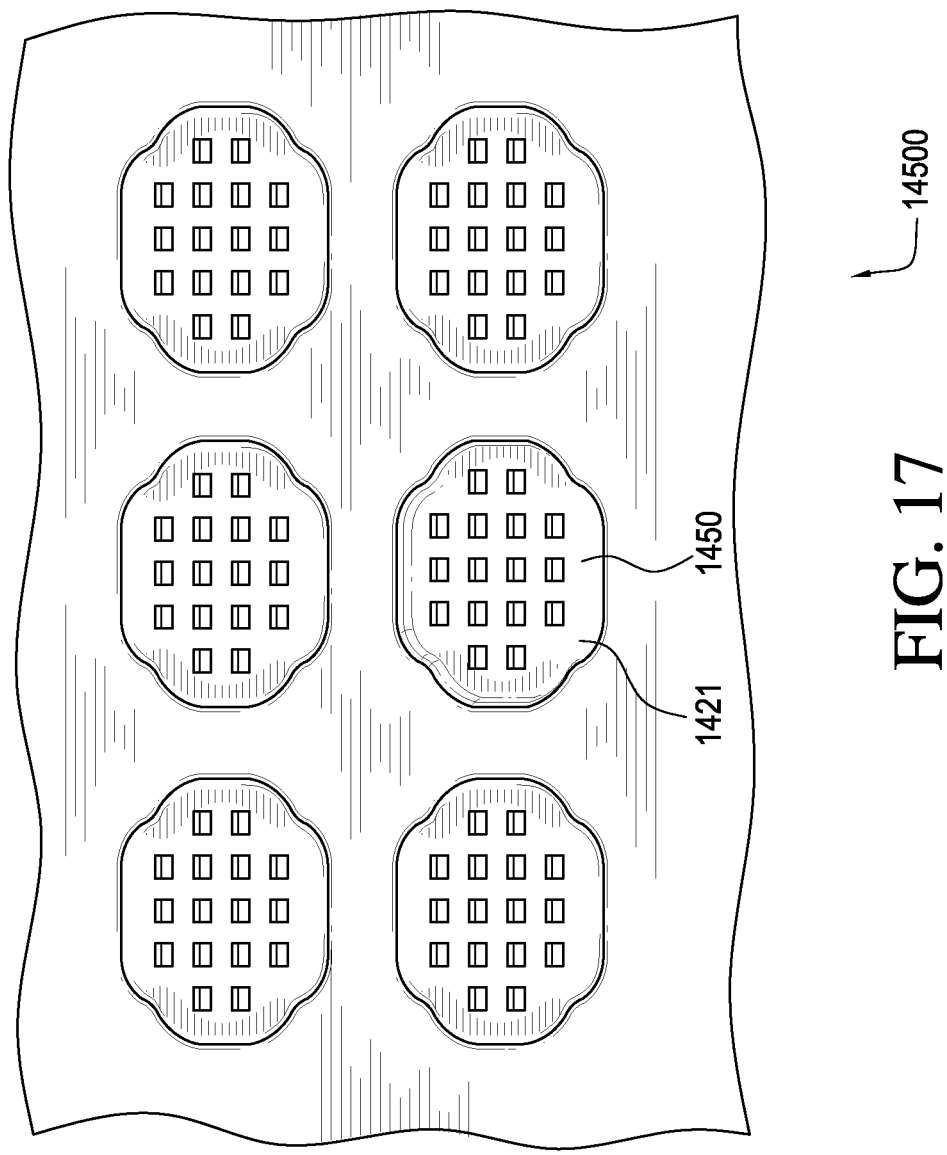
FIG. 17 shows a top view of the collapsed conductive membrane from FIG. 16, contrasted with un-collapsed conductive membranes of other MEMS devices.

In the present example, MEMS array 14500 is configured to register exposure to a first shock threshold level of a shockwave. Such exposure can be registered by one or more of the MEMS devices of MEMS array 14500. For example, skipping ahead in the figures, FIG. 16 illustrates a cross-sectional view of MEMS device 1350 with conductive membrane permanently collapsed and shorted with conductive base 1320 as a result of the pressure and/or vibration exerted thereupon by a shockwave exceeding the first shock threshold level. FIG. 17 shows a top view of the collapsed conductive membrane 1421 of MEMS device 1350, as part of MEMS array 14500, contrasted with other un-collapsed MEMS devices thereof In some examples, the first shock threshold level can correspond to a predetermined pressure, vibration, or acceleration level of a shockwave incident upon MEMS array 14500. There can also be examples where the first shock threshold level may be set based on the type of shockwave expected to be detected, such as blast or explosion waves in battlefield, mining, and/or police bomb-squad scenarios, or consistent waves emanating from high-intensity devices such as jet engines and/or other loud machinery.

Returning to FIG. 14, semiconductor device 1400 comprises electronic device 1411 coupled to MEMS array 14500 in the present example. Electronic device 1411 is integrated with MEMS array 14500, both being formed over substrate 1310 during the same semiconductor process flow. There can be other examples, however, where electronic device 1411 may not be integrated with electronic MEMS array 14500, such as when electronic device 1411 is separate from semiconductor device 1300 or when it is attached over substrate 1310 after MEMS array 14500 has been formed. In some examples, electronic device 1411 can be similar to electronic device 311 (FIG. 3).

Figure 15:
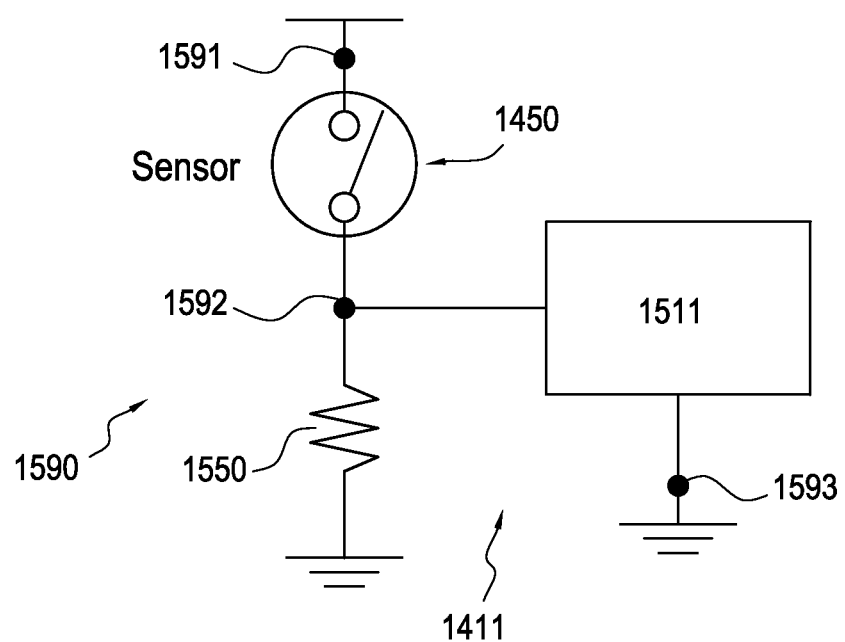
FIG. 15 illustrates a schematic of an exemplary shock threshold detection circuit comprising an electronic device and the MEMS device of FIG. 13.

FIG. 15 illustrates a schematic of an exemplary shock threshold detection circuit 1500 comprising electronic device 1411 and MEMS device 1450 of MEMS array 14500. In the present example, electronic device 1411 comprises display element 1511 configured to present information regarding whether MEMS device 1350 and/or MEMS array 14500 have been exposed to the first shock threshold level. Although display element 1511 comprises an electrophoretic display element in the present example, other types of display elements can be used in other embodiments. Electronic device 1411 also comprises conductive path 1590 between display element 1511 and MEMS device array 14500 to actuate display element 1511 when MEMS device 1350 and/or MEMS array 14500 become active after having been exposed to the first shock threshold level. Conductive path 1590 comprises nodes 1591-1593 in the present example, where node 1591 is configured to couple a power source to electrode 1491 (FIG. 14) of MEMS array 14500, where node 1592 is configured to couple electrode 1492 (FIG. 14) of MEMS array 14500 to electronic device 1511, and where node 1593 is configured to provide a ground path for display element 1511. In addition, electronic device 1411 comprises resistor 1550 coupled to conductive path 1590 in the present example, where resistor 1550 is configured to operate as a pull-down resistor. In some examples, resistor 1550 may be fabricated over substrate 1310 (FIG. 13) along with MEMS array 14500 and/or electronic device 1411.

Returning to FIG. 14, in the present embodiment, the MEMS devices of MEMS array 14500 are configured to short electrodes 1491 and 1492 together when exposed to the first shock threshold level. For example, conductive base 1420 of MEMS device 1450 is coupled to electrode 1492 and to other conductive bases of other MEMS devices of MEMS array 14500 via conductive layer 14200, while conductive membrane 1421 is coupled to electrode 1491 and to other conductive membranes of other MEMS devices of MEMS array 14500 via membrane layer 13210 in the present example, such that when a shockwave exceeding the first shock threshold level is incident upon MEMS device 1450 and/or MEMS array 14500, conductive membrane 1421 is flexed by the shockwave to permanently deform and contact conductive base 1420, thereby shorting electrodes 1491 and 1492 together to enable power to flow between nodes 1591-1592 to electronic device 1511 (FIG. 15).

In the present example, conductive membranes of the MEMS devices of MEMS array 14500, like conductive membrane 1421, and conductive bases of the MEMS devices of MEMS array 14500, like conductive base 1420, can be formed integrally as part of the semiconductor process flow for semiconductor device 1400. In the same or other examples, the conductive bases of array 14500 can be comprised by, or be inherently interconnected by, conductive layer 14200. Similarly, the conductive membranes of array 14500 can be comprised by, or be inherently interconnected by, membrane layer 13210.

There may be examples like that of FIG. 13, where conductive layer 13200 is patterned such that conductive base 1320 is delimited within sacrificial compartment 1370. In such examples, the conducive bases of different MEMS devices may be coupled or shorted together via jumpers or traces of semiconductor device 1300. In contrast, in the example of FIG. 14, conductive layer 14200 extends to comprise the conductive bases of the MEMS devices of MEMS array 14500, such as conductive base 1420. Accordingly, conductive layer 14200 is essentially shared as a single, common conductive base for the different MEMS devices of MEMS array 14500 in FIG. 14.

Although in the present example of FIG. 14 conductive membrane 1421 of MEMS device 1450 is not delimited by compartment wall 1422, such that membrane layer 13210 extends across MEMS array 1450 to comprise and interconnect the conductive membranes of the MEMS devices of MEMS array 14500, there can be embodiments where the conductive membranes of the MEMS devices may be delimited by their respective compartment walls. In such embodiments, the conductive membranes may be coupled or shorted together via jumpers or traces of the semiconductor device if desired.

In some examples, a first sensitivity to the first shock threshold level can be determined for a MEMS device, such as MEMS device 1350 (FIG. 13), by one or more attributes such as (a) a thickness of the air gap between conductive base 1320 and conductive membrane 1321, (b) a diameter of conductive membrane 1321, (c) a thickness of conductive membrane 1321, (d) a rigidity of conductive membrane 1321, and/or (e) a material of conductive membrane 1321. In the same or other examples, one or more of the attributes above may be tailored such that membrane 1321 can deform sufficiently to short with conductive base 1320 when exposed to a first shock threshold level, but not when exposed to a weaker shockwave with a lower shock level. In some examples, the first sensitivity can be set for a predetermined level selectable between approximately 50 KPa to approximately 500 KPa.

In the embodiment of FIG. 14, each of the MEMS devices of MEMS array 14500 may be configured to comprise the first sensitivity, thereby imparting redundancy to the detection ability of MEMS array 14500. There can be other embodiments where a second portion of the MEMS devices of MEMS array 14500 can comprise a second sensitivity for a second shock threshold level different than the first shock threshold level of a first portion of the MEMS devices of MEMS array 14500. In such examples, the MEMS devices with the second sensitivity may be coupled to a display element similar to display element 1511 (FIG. 15) but configured to indicate exposure to the second shock threshold level.

Figure 18:
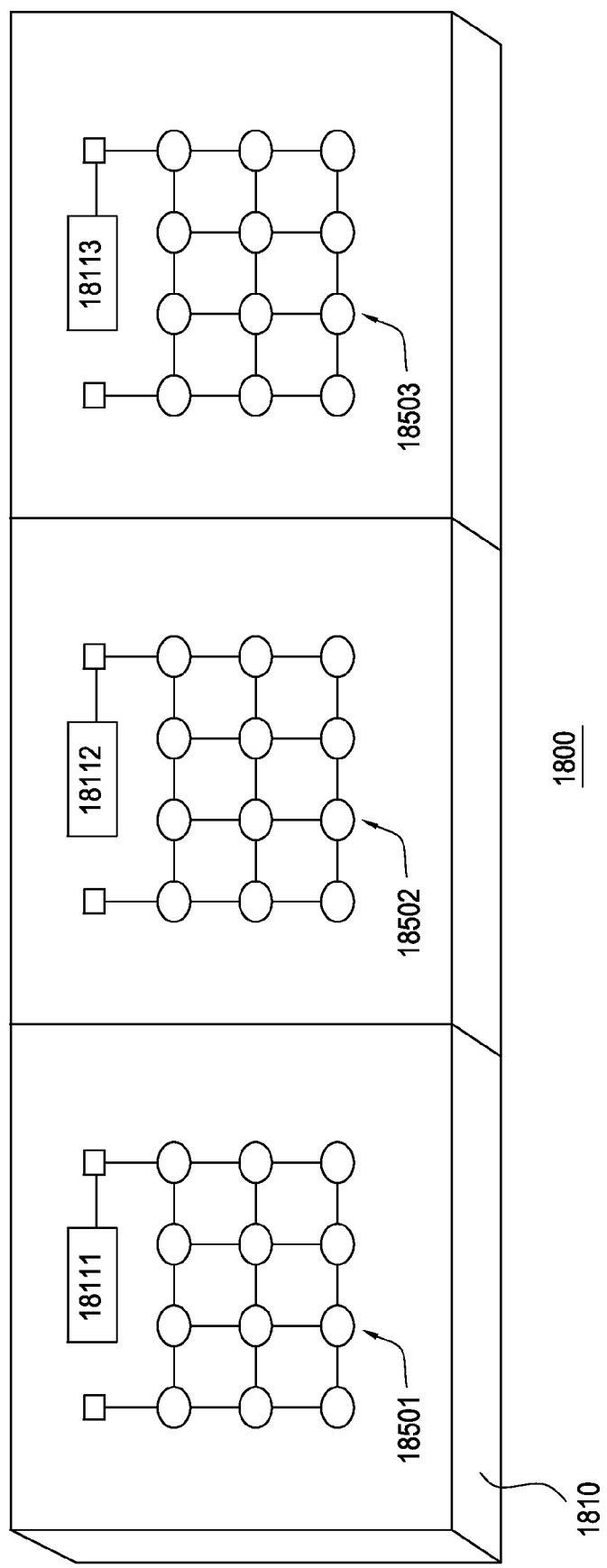
FIG. 18 illustrates a top view of a semiconductor device comprising multiple MEMS arrays similar to the MEMS array of FIG. 14.

FIG. 18 illustrates a top view of semiconductor device 1800 comprising MEMS arrays 18501-18503 similar to MEMS array 14500 (FIG. 14). MEMS arrays 18501-18503 are fabricated over a common substrate 1810, although there can be similar embodiments where MEMS arrays 18501-18503 are each fabricated over respective different substrates.

In the present example, the MEMS devices of MEMS array 18501 are responsive to a first shock threshold level; the MEMS devices of MEMS array 18502 are responsive to the second shock threshold level; and the MEMS devices of MEMS array 18503 are responsive to a third shock threshold level, where the third shock threshold level is greater than the second shock threshold level, and the second shock threshold level is greater than the first shock threshold level. As a result, a sensitivity of MEMS array 18501 is greater than a sensitivity of MEMS array 18502, and the sensitivity of MEMS array 18502 is greater than a sensitivity of MEMS array 18503. MEMS arrays 18501-18503 are also correspondingly coupled to display elements 18111-18113, which can be similar to display element 1511 (FIG. 15). In the present example, display elements 18111-18113 are arranged with respect to each other to represent a thermometer code that can be used to ascertain a peak shock level experienced by semiconductor device 1800, and/or by a user carrying semiconductor device 1800. Accordingly, when exposed to the first shock threshold level, only the MEMS devices of MEMS array 18501 deform sufficiently to short and thereby actuate display element 18111. Similarly, when exposed to the second shock threshold level, only the MEMS devices of MEMS arrays 18501-18502 will deform sufficiently to short and thereby respectively actuate display elements 18111-18112. Correspondingly, when exposed to the third shock threshold level, the MEMS devices of each of MEMS arrays 18501-18503 will deform sufficiently to short and thereby actuate display elements 18111-18113.

Figure 19:
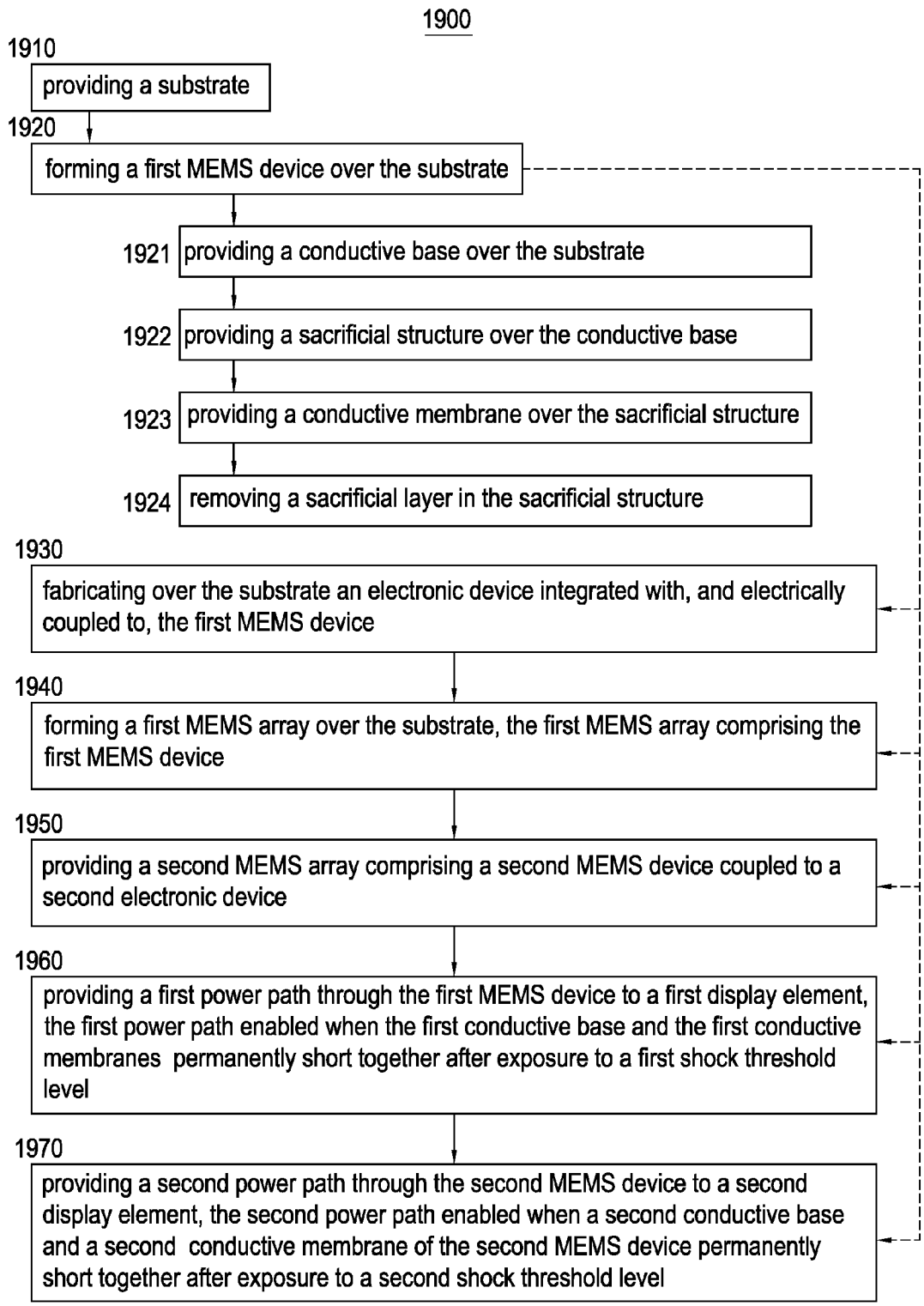
FIG. 19 illustrates a flowchart of a method for providing a semiconductor device in accordance with FIGS. 13-18.

Moving on, FIG. 19 illustrates a flowchart of method 1900 for providing a semiconductor device. In some examples, method 1900 can be similar to method 400 (FIG. 4), but with respect to FIGS. 3-18.

Procedure 1910 of method 1900 comprises providing a substrate. In some examples, procedure 1910 can be similar to procedure 410 of method 400 the substrate can be a flexible substrate. There can be examples where the substrate can comprise a PEN material, a PET material, a polyimide, a polycarbonate, a cyclic olefin copolymer, and/or a liquid crystal polymer. In the same or other examples, the substrate can be similar to substrate 1310 (FIGS. 13, 14, 16) and/or to substrate 1810 (FIG. 18). In some examples, a planarization layer similar to planarization layer 1311 (FIG. 13) can be provided over the substrate.

Procedure 1920 of method 1900 comprises forming a first MEMS device over the substrate. In some examples, procedure 1920 can be similar to procedure 420 of method 400 (FIG. 4). In the same or other examples, the first MEMS device can be similar to MEMS device 1350 (FIGS. 13, 16) and/or to MEMS device 1450 (FIG. 14-15). There can be examples where procedure 1920 can be carried out at temperatures not exceeding 190 degrees Celsius, such as to avoid affecting the substrate.

In some implementations, procedure 1920 can comprise one or more of several subparts, such as procedures 1921-1924.

Procedure 1921 comprises providing a conductive base over the substrate. In some examples, procedure 1921 can be similar to procedure 421 of method 400 (FIG. 4). In the same or other examples, the conductive base of procedure 1921 can be similar to conductive base 1320 and/or conductive layer 13200 (FIGS. 13, 16) of MEMS device 1350.

Procedure 1922 comprises providing a sacrificial structure over the conductive base. In some examples, procedure 1922 can be similar to procedure 423 of method 400 (FIG. 4). In the same or other examples, the sacrificial structure of procedure 1922 can be similar to, and/or can comprise, wall structure 1322 (FIGS. 13, 16) of MEMS device 1350.

Procedure 1923 comprises providing a conductive membrane over the sacrificial structure. In some examples, procedure 1923 can be similar to procedure 424 of method 400 (FIG. 4). In the same or other examples, the conductive membrane of procedure 1923 can be similar to conductive membrane 1321 and/or membrane layer 13210 (FIGS. 13, 16) of MEMS device 1350.

Procedure 1924 comprises removing a sacrificial layer in the sacrificial structure. In some examples, procedure 1923 can be similar to procedure 425 of method 400 (FIG. 4). In the same or other examples, the sacrificial layer can be similar to sacrificial layer 1325 (FIGS. 13, 16). As an example, the sacrificial layer can be provided in procedure 1922 over the conductive base of procedure 1921, and the sacrificial layer can then be removed in procedure 1924 from within the sacrificial structure to expose the conductive base and to form a sacrificial compartment bounded by a compartment wall of the sacrificial structure. In some implementations, the sacrificial compartment can be similar to sacrificial compartment 1370, as bounded by wall structure 1322 (FIGS. 13, 16). In the same or other embodiments, the compartment wall can comprise and/or be formed from the sacrificial layer that remains at a perimeter of the sacrificial structure once the sacrificial compartment is formed.

There can be examples where the sacrificial compartment can be formed in procedure 1924 via an etching process by etching through the sacrificial layer, over the compartment area of the sacrificial compartment, to the conductive base. In such examples, when the etching is completed, the compartment wall remains bounding the sacrificial compartment. In some implementations the sacrificial layer that remains unetched at the perimeter of the sacrificial structure defines the compartment wall. In some examples, the sacrificial layer can comprise a silicon material like amorphous silicon, and/or a thickness of approximately 0.08 microns to approximately 2 microns. In the same or other examples, the material of the sacrificial layer may be undoped, or may be lightly doped, such that the conductive base of procedure 1921 and the conductive membrane of procedure 1923 will be substantially electrically isolated from each other by the compartment wall. There can be examples where the etching described above can comprise a dry etching process that uses a dry reactant and/or a gaseous reactant to carve sacrificial compartment 1370 out of sacrificial layer 1325 (FIG. 13). In the same or other examples, the etching process can rely on an $XeF_2$ reactant. There can be examples where the etch reactant may need to be refreshed or replenished, such that several etch cycles may be needed to adequately etch through the sacrificial layer and to form the sacrificial compartment. In one such example, each of the etch cycles may be carried out for approximately 60 seconds at approximately 2.7 mTorr of expansion pressure. The etch rate may be approximately 2.5 microns to 3.0 microns per minute in the same or other examples. The number of etch cycles may vary from approximately 5 cycles to approximately 20 cycles, depending on the dimensions of the MEMS device. For example, for a MEMS device with a sacrificial compartment having a radius of approximately 70 microns, approximately 8 etch cycles may be needed. In another example, for a MEMS device with a sacrificial compartment having a radius of approximately 200 microns, approximately 15 etch cycles may be needed.

In some examples, the conductive membrane of procedure 1923 can comprise a substantially circular perimeter coupled to the perimeter of the sacrificial structure of procedure 1922. For example, the compartment wall of the sacrificial structure may suspend the conductive membrane over the conductive base after the sacrificial layer has been removed in procedure 1924.

Although there can be examples where the sacrificial layer in the sacrificial structure may be removed prior to providing the conductive membrane in procedure 1923, there can be examples where the sacrificial layer can be removed via one or more openings through the conductive membrane. As an example, the one or more openings can be similar to membrane openings 1323 (FIGS. 13, 16-17). For example, an etching process such as described above can etch through sacrificial layer 1325, via membrane openings 1323, to expose conductive base 1320 and to form sacrificial compartment 1370 (FIGS. 13, 16). In some examples, approximately 15% to approximately 40% of a total area of the conductive membrane may comprise the one or more openings, such as not to excessively affect the sensitivity of the first MEMS device.

There may be implementations where one or both of the conductive base of procedure 1921 and/or the conductive membrane of procedure 1923 may be patterned or etched to a desired shape. For example, as seen in FIG. 13, conductive layer 13200 has been patterned such that conductive base 1320 lies within wall structure 1322. In addition, conductive membrane 1321 has been patterned to form membrane openings 1323. In such examples the etching of the conductive base and/or of the conductive membrane can be carried out via a phosphoric acetic nitric (PAN) etch for conductive materials thereof, such as aluminum. In some examples, the PAN etch may be in a 16:1:1 ratio. There may be other implementations where the conductive base need not be patterned to lie only within the sacrificial structure. In such examples, the compartment wall of the sacrificial compartment may rest over the conductive base, rather than directly over the substrate.

In some examples, the first MEMS device of procedure 1921 can be provided with a first sensitivity for a first shock threshold level. In such examples, the first sensitivity may be determined and/or tailored Method 1900 can, in some examples, comprise procedure 1930 for fabricating over the substrate an electronic device integrated with, and electrically coupled to, the first MEMS device. In some examples, procedure 1930 can be similar to procedure 450 (FIG. 4).

In the same or other examples, the electronic device of procedure 1930 can be similar to electronic device 1411 (FIGS. 14-15). In some examples, the electronic device can comprise a display element configured to present information concerning whether the first MEMS device has been exposed to a first shock threshold level of a shockwave. As an example, the display element can be similar to display element 1511 (FIG. 15).

In the same or other examples, the electronic device of procedure 1930 can comprise a continuity detection circuit responsive to a short between the conductive base and the conductive membrane, the short being permanent and caused by exposure of the conductive membrane to the first shock threshold level, where the shockwave causes the conductive membrane to flex and/or deform to contact the conductive base of the first MEMS device. In one example, the continuity detection circuit may be coupled between the first MEMS device and the display element, and may comprise or be similar to conductive path 1590 (FIG. 15). In some examples, when the continuity detection circuit is completed by the short between the conductive base and the conductive membrane, power may flow via the first MEMS device, from a power source to the display element, such that the display element may be lit to indicate exposure to the first shock threshold level.

In the same or other examples, the electronic device of procedure 1930 may comprise a transistor, such as a thin film transistor, sharing a common metallic layer with the first MEMS device. In such examples, the transistor may be part of or coupled to display element 1511, and/or may be part of or coupled to an electronic device like electronic device 12500 (FIG. 12).

Method 1900 can, in some examples, comprise procedure 1940 for forming a first MEMS array over the substrate, the first MEMS array comprising the first MEMS device. In some examples, the first MEMS array can be similar to MEMS array 14500 (FIG. 14), and/or to MEMS arrays 18501-18503

(FIG. 18). There can be some implementations where each MEMS device of the first MEMS array is configured to comprise the same first sensitivity described above with respect to the first MEMS device. In other examples, some MEMS devices one or more MEMS devices of the first MEMS array may be configured to comprise a second sensitivity different than the first sensitivity.

In some implementations, method 1900 can comprise procedure 1950 for providing a second MEMS array comprising a second MEMS device coupled to a second electronic device. In some examples, the second MEMS device can be similar to the first MEMS device of procedure 1920, but comprising a second conductive base, a second conductive membrane movably suspended over the second conductive base, and a second sensitivity for a second shock threshold level. Similarly, the second electronic device can be similar to the first electronic device of procedure 1930. The second MEMS array can be similar in some implementations to one or MEMS arrays 18502-18503 (FIG. 18). There can be examples where the first and second MEMS arrays are fabricated over the same substrate, as shown in FIG. 18 for substrate 1810, and examples where the first and second arrays are fabricated over different or distinct substrates.

In some implementations, method 1900 can comprise procedure 1960 for providing a first power path through the first MEMS device to a first display element, the first power path being enabled when the first conductive base and the first conductive membranes permanently short together after exposure to a first shock threshold level. In some examples, the first power path can be similar to conductive path 1590 as described above with respect to FIG. 15 for MEMS device 1350, MEMS array 14500, and display element 1511.

In some implementations, method 1900 can comprise procedure 1970 for providing a second power path through the second MEMS device to a second display element, the second power path being enabled when the second conductive base and the second conductive membranes permanently short together after exposure to a second shock threshold level. The second power path also can be similar to conductive path 1590 (FIG. 15), but with respect to the second MEMS device and the second MEMS array of procedure 1950. In some examples, the first and second display elements of procedures 1960 and 1970 may be arranged with respect to each other to represent a thermometer code that can be used to ascertain a peak shock level experienced by the semiconductor device of method 1900, as described above with respect to display elements 18111-18113 for FIG. 18.

In some examples, one or more of the different procedures of method 1900 can be combined into a single step or performed simultaneously, and/or the sequence of such procedures can be changed. For example, procedures 1920, 1930, 1940, and 1950 could be carried out simultaneously.

There can also be examples where method 1900 can comprise further or different procedures. As an example, a procedure could be included to add further MEMS devices and/or MEMS arrays with sensitivities tailored for other shock threshold levels. Other variations can be implemented for method 1900 without departing from the scope of the present disclosure.

Although the embedded MEMS sensors and related methods herein have been described with reference to specific embodiments, various changes may be made without departing from the spirit or scope of the present disclosure. For example, even though openings 1323 of MEMS device 1350 (FIG. 14) have been presented as square-shaped, there can be embodiments with similar openings comprising other geometrical perimeters. Additional examples of such changes have been given in the foregoing description. Accordingly, the disclosure of embodiments herein is intended to be illustrative of the scope of the invention and is not intended to be limiting. It is intended that the scope of this application shall be limited only to the extent required by the appended claims. The embedded MEMS sensors and related methods discussed herein may be implemented in a variety of embodiments, and the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor device, comprising:
   a substrate;
   a first MEMS array comprising one or more first MEMS devices located over the substrate and configured to short upon exposure to at least a first shock threshold level of a shockwave; and
   an electronic device;
   wherein:
   the electronic device comprises at least one of:
     a first display element configured to present information concerning whether the first MEMS array has been exposed to at least the first shock threshold level;
     a first conductive path between the display element and the first MEMS array to actuate the display element when the first MEMS array is active after having been exposed to at least the first shock threshold level; or
     a resistor coupled to the first conductive path;
   and
   the first conductive path comprises:
     a first node coupled to a first electrode of the first MEMS array, and configured to couple the first electrode to a power source; a second node coupled between the display element and a second electrode of the first MEMS array and configured to route power to the display element when the first MEMS array is activated after having been exposed to at least the first shock threshold level; and a third node coupled between the display element and ground.

2. The semiconductor device of claim 1, wherein:
   the substrate comprises a flexible substrate; and
   the first MEMS array is fabricated over the flexible substrate.

3. The semiconductor device of claim 1, wherein: the electronic device is fabricated over the substrate; and
   the electronic device is integrated with, and electrically coupled to, the first MEMS array.

4. The semiconductor device of claim 1, wherein:
the resistor comprises a pull down resistor coupled between the second and third nodes of the first conductive path; and
the first display element comprises an electrophoretic display element.

5. The semiconductor device of claim 1, wherein:
at least a first MEMS device of the one or more first MEMS devices comprises:
a conductive base located over the substrate; and
a conductive membrane movably suspended over the conductive base.

6. The semiconductor device of claim 5, wherein:
the conductive membrane is configured to be deformed towards the conductive base by the shockwave such as to remain in permanent contact with the conductive base after being exposed to at least the first shock threshold level.

7. The semiconductor device of claim 5, further comprising:
a common metallic layer over the substrate; and
at least one transistor fabricated over the flexible substrate and electrically coupled to the first MEMS device;
wherein the common metallic layer comprises:
the conductive base of the first MEMS device; and
a gate of the at least one transistor.

8. The semiconductor device of claim 5, wherein:
the first MEMS device comprises:
a sacrificial compartment between the conductive membrane and the conductive base.

9. The semiconductor device of claim 8, wherein:
the substrate comprises at least one of a PEN material, a PET material, a PES material, a polyimide, a polycarbonate, a cyclic olefin copolymer, or a liquid crystal polymer;
the conductive membrane comprises at least one of a chromium material, a silver material, an aluminum material, a titanium material, or a copper material;
the conductive membrane comprises approximately 5 openings to approximately 20 openings into the sacrificial compartment;
the one or more MEMS devices comprise circular perimeters with radii of approximately 50 micrometers to approximately 250 micrometers;
the sacrificial compartment defines an air gap of approximately 0.08 microns to approximately 2 microns between the conductive membrane and the conductive base; and
the conductive membrane is substantially circular.

10. The semiconductor device of claim 5, further comprising:
a wall structure located over at least one of:
the conductive base; or
the substrate;
wherein the conductive membrane is supported at a perimeter of the conductive membrane by the wall structure.

11. The semiconductor device of claim 10, wherein:
the wall structure circumscribes a perimeter of the first MEMS device and comprises at least one of:
one or more dielectric layers; or
an amorphous silicon layer.

12. The semiconductor device of claim 5, wherein:
the first MEMS device comprises a first sensitivity for the first shock threshold level; and
the first sensitivity is determined by at least one of:
a thickness of an air gap between the conductive membrane and the conductive base;
a diameter of the conductive membrane;
a thickness of the conductive membrane;
a rigidity of the conductive membrane; or
a material of the conductive membrane.

13. The semiconductor device of claim 12, wherein:
each of the one or more MEMS devices of the first MEMS array comprises the first sensitivity.

14. The semiconductor device of claim 12, further comprising:
a second MEMS device comprising:
a second conductive base;
a second conductive membrane movably suspended over the second conductive base; and
a second sensitivity to a second shock threshold level different from the first shock threshold level.

15. The semiconductor device of claim 14, further comprising:
a second display element; and
a second conductive path through the second MEMS device to the second display element;
wherein:
the first display element is integrated with, and electrically coupled to, the first MEMS device;
the second display element is integrated with, and electrically coupled to, the second MEMS device;
the conductive membrane is configured to permanently short with the conductive base after exposure to at least the first shock threshold level to complete the first conductive path to the first display element; and
the second conductive membrane is configured to permanently short with the second conductive base after exposure to at least the second shock threshold level to complete the second conductive path to the second display element.

16. The semiconductor device of claim 15, further comprising:
a plurality of MEMS devices responsive to a plurality of shock threshold levels;
a plurality of display elements coupled to respective ones of the plurality of MEMS devices; and
a thermometer code display comprising the plurality of display elements;
wherein:
the plurality of MEMS devices comprises at least the first MEMS device and the second MEMS device;
the plurality of shock threshold levels comprises the first shock threshold level and second shock threshold level;
the plurality of display elements comprises the first and second display elements; and
the thermometer code display is configured to indicate exposure of the plurality of MEMS devices to one or more of the plurality of shock threshold levels via a thermometer code represented by the plurality of display elements.

17. The semiconductor device of claim 14, wherein:
the first MEMS array comprises the second MEMS device.

18. The semiconductor device of claim 14, further comprising:
a second MEMS array located over the substrate;
wherein the second MEMS array comprises the second MEMS device.

19. The semiconductor device of claim 14, further comprising:
a second substrate; and
a second MEMS array located over the substrate;

wherein the second MEMS array comprises the second MEMS device.

20. A semiconductor device, comprising:
a substrate;
a first MEMS array comprising one or more first MEMS devices located over the substrate and configured to short for registering exposure to at least a first shock threshold level of a shockwave;
an electronic device integrated with the substrate and the first MEMS array;
a second MEMS device comprising:
    a second conductive base; and
    a second conductive membrane movably suspended over the second conductive base;
and
a second display element integrated with, and electrically coupled to, the second MEMS device;
wherein:
    the substrate comprises a flexible substrate;
    at least a first MEMS device of the one or more first MEMS devices comprises:
        a first conductive base located over the substrate;
        a first sacrificial compartment located over the first conductive base and bounded by a compartment wall; and
        a first conductive membrane movably suspended over the first conductive base by the compartment wall;
    the first conductive membrane is configured to be deformed by the shockwave to permanently short with the first conductive base after being exposed to at least the first shock threshold level;
    the electronic device comprises:
        a first display element; and
        a first conductive path between the display element and the first MEMS array to source power to the display element when the first conductive membrane and the first conductive base of the first MEMS device are shorted together;
    the second conductive membrane is configured to short with the second conductive base after being exposed to at least a second shock threshold level to source power to the second display element;
    the substrate comprises at least one of a PEN material, a PET material, a PES material, a polyimide, a polycarbonate, a cyclic olefin copolymer, or a liquid crystal polymer;
    the first conductive membrane comprises at least one of a chromium material, a silver material, an aluminum material, a titanium material, or a copper material;
    the first conductive membrane comprises between approximately 5 openings to approximately 20 openings into the sacrificial compartment;
    the first MEMS device comprises a circular perimeter with a radius of between approximately 50 micrometers to approximately 250 micrometers;
    the first sacrificial compartment defines a first air gap of approximately 0.08 microns to approximately 2 microns between the first conductive membrane and the first conductive base;
    the first conductive membrane is substantially circular;
    the first MEMS device comprises a first sensitivity for the first shock threshold level, the first sensitivity being established by at least one of:
        a thickness of the first air gap;
        a diameter of the first conductive membrane;
        a thickness of the first conductive membrane;
        a rigidity of the first conductive membrane; or
        a material of the first conductive membrane;
    the second MEMS device comprises a second sensitivity for the second shock threshold level different from the first shock threshold level; and
    the first and second display elements are arranged to present a thermometer code indicative of a peak shock threshold level exposure.

* * * * *